United States Patent
Toda et al.

(10) Patent No.: US 7,459,715 B2
(45) Date of Patent: Dec. 2, 2008

(54) RESISTANCE CHANGE MEMORY DEVICE

(75) Inventors: Haruki Toda, Yokohama (JP); Koichi Kubo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/761,318

(22) Filed: Jun. 11, 2007

(65) Prior Publication Data

US 2007/0285964 A1 Dec. 13, 2007

(51) Int. Cl.
*H01L 29/02* (2006.01)
*G11C 11/00* (2006.01)

(52) U.S. Cl. .................. 257/2; 257/3; 257/4; 257/5; 257/246; 257/248; 257/E45.002; 365/148; 439/936

(58) Field of Classification Search .............. 257/1–5, 257/213, 215, 245, 246, 247, 248, 751; 174/521; 439/936; 365/148, 163, 233.16, 230.03; 369/13.38

See application file for complete search history.

(56) References Cited

U.S. PATENT DOCUMENTS

| | | | | |
|---|---|---|---|---|
| 5,657,292 | A | * | 8/1997 | McClure ............... 365/233.16 |
| 5,714,768 | A | | 2/1998 | Ovshinsky et al. |
| 5,825,046 | A | | 10/1998 | Czubatyj et al. |
| 5,955,785 | A | * | 9/1999 | Gardner et al. ............... 257/751 |
| 6,141,241 | A | * | 10/2000 | Ovshinsky et al. .......... 365/163 |
| 6,351,427 | B1 | * | 2/2002 | Brown .................... 365/230.03 |
| 6,426,891 | B1 | | 7/2002 | Katori |
| 6,815,744 | B1 | | 11/2004 | Beck et al. |
| 7,394,680 | B2 | * | 7/2008 | Toda et al. ................... 365/148 |
| 7,400,522 | B2 | * | 7/2008 | Toda et al. ................... 365/163 |
| 2007/0133358 | A1 | * | 6/2007 | Kubo et al. ............... 369/13.38 |
| 2007/0285964 | A1 | * | 12/2007 | Toda et al. ................... 365/148 |

(Continued)

FOREIGN PATENT DOCUMENTS

WO WO 03/085675 A3 10/2003

(Continued)

OTHER PUBLICATIONS

Kazuya Nakayama et al., "Submicron Nonvolatile Memory Cell Based on Reversible Phase Transition in Chalcogenide Glasses" Jpn. J. Appl. Phys vol. 39 (2000) pp. 6157-6161, Part 1 No. 11, Nov. 2000.*

(Continued)

*Primary Examiner*—Sue A. Purvis
*Assistant Examiner*—Jami M Valentine
(74) *Attorney, Agent, or Firm*—Oblon, Spivak, McClelland, Maier & Neustadt, P.C.

(57) ABSTRACT

A resistance change memory device including: a semiconductor substrate; cell arrays stacked above the substrate, bit lines and word lines; a read/write circuit formed on the semiconductor substrate; first and second vertical wirings connecting bit lines to the read/write circuit; and third vertical wirings connecting word lines to the read/write circuit, wherein the memory cell includes a variable resistance element. The variable resistance element has: a recording layer formed of a composite compound containing at least one transition element and a cavity site for housing a cation ion; and electrodes formed on the opposite sides of the recording layer, one of the electrodes serving as a cation source in a write or erase mode for supplying a cation to the recording layer to be housed in the cavity site therein.

24 Claims, 23 Drawing Sheets

U.S. PATENT DOCUMENTS

| | | | |
|---|---|---|---|
| 2007/0285965 A1* | 12/2007 | Toda et al. | 365/148 |
| 2007/0285966 A1* | 12/2007 | Toda et al. | 365/148 |
| 2007/0285967 A1* | 12/2007 | Toda et al. | 365/148 |
| 2007/0285969 A1* | 12/2007 | Toda et al. | 365/148 |
| 2007/0285971 A1* | 12/2007 | Toda et al. | 365/148 |
| 2008/0002455 A1* | 1/2008 | Toda et al. | 365/148 |
| 2008/0002457 A1* | 1/2008 | Toda et al. | 365/148 |

FOREIGN PATENT DOCUMENTS

| | | |
|---|---|---|
| WO | WO 2004/084228 A1 | 9/2004 |
| WO | WO 2004/084229 A1 | 9/2004 |
| WO | WO 2004/090984 A1 | 10/2004 |

OTHER PUBLICATIONS

Mark Johnson et al., "512-Mb PROM With a Three-Dimensional Array of Diode/Antifuse Memory Cells", IEEE Journal of Solid-State Circuits, vol. 38, No. 11, Nov. 2003, pp. 1920-1928.*

Matthew Crowley et al., "512Mb PROM with 8 Layers of Antifuse/Diode Cells", ISSCC 2003 / Session 16 / Non-Volatile Memory / Paper 16.4.*

* cited by examiner

FIG. 27

Spinel (AM$_2$O$_4$)

| A \ M | Al | Ge:Ni=0.5:0.5 | Sn:Ni=0.5:0.5 | Ti:Ni=0.5:0.5 | V | Cr | Mn | Fe | Co |
|---|---|---|---|---|---|---|---|---|---|
| Mg |  | ○ | ○ | ○ | ○ | ○ | ○ | ○ | ○ |
| Zn |  | ○ | ○ | ○ | ○ | ○ | ○ | ○ | ○ |
| Cu | ○ | ○ | ○ | ○ | ○ | ○ | ○ | ○ | ○ |
| Cr | ○ |  |  |  | ○ |  |  |  |  |
| Mn | ○ |  |  |  | ○ | ○ |  |  |  |
| Fe | ○ |  |  |  | ○ | ○ | ○ |  |  |
| Co | ○ |  |  |  | ○ | ○ | ○ | ○ |  |

FIG. 28

Ilmenite (AMO$_3$)

| A \ M | Ge | Sn | Ti | Ta(Nb) | Mn | Fe:Nb(Ta)=0.5:0.5 | Co:Nb(Ta)=0.5:0.5 | Ni:Mo(W)=0.5:0.5 | Cu:Mo(W)=0.5:0.5 |
|---|---|---|---|---|---|---|---|---|---|
| Mg | ○ | ○ | ○ |  | ○ | ○ | ○ | ○ | ○ |
| Zn | ○ | ○ | ○ |  | ○ | ○ | ○ | ○ | ○ |
| Cr | ○ | ○ | ○ |  |  |  |  |  |  |
| Mn | ○ | ○ | ○ |  |  |  |  |  |  |
| Fe | ○ | ○ | ○ |  |  |  |  |  |  |
| Co | ○ | ○ | ○ |  |  |  |  |  |  |
| Ni | ○ | ○ | ○ |  |  |  |  |  |  |
| Cu | ○ | ○ | ○ | ○ | ○ |  |  |  |  |

FIG. 29

Wolframite (AMO4)

| A \ M | Mo(W) | Nb(Ta) |
|---|---|---|
| Mg | O | |
| Zn | O | |
| Cr | O | |
| Mn | O | |
| Fe | O | |
| Co | O | |
| Ni | O | |
| Cu | O | |
| Al | | O |
| In | | O |
| Cr | | O |

FIG. 30

Hollandite (AxMO2)

| A \ M | Ti | Mn |
|---|---|---|
| Ba (small amount) | O | O |
| Sr (small amount) | O | O |
| Ca (small amount) | O | O |
| — | O | O |

FIG. 31

Ramsdelite (AxMO2)

| A \ M | Ti | Mn |
|---|---|---|
| Zn (small amount) | O | O |
| Mg (small amount) | O | O |
| — | O | O |

FIG. 32

Perovskite (AMO3)

| A \ M | Al | Ga | Ti | V | Cr | Mn | Fe | Co | Ni |
|---|---|---|---|---|---|---|---|---|---|
| Ca |  |  | O | O | O | O |  |  |  |
| Sr |  |  | O | O | O | O |  |  |  |
| Ba |  |  | O | O | O | O |  |  |  |
| La | O | O | O | O | O | O | O | O | O |
| Y | O | O | O | O | O | O | O | O | O |
| Lanthanoid (except Ce,Tb) | O | O | O | O | O | O | O | O | O |

RESISTANCE CHANGE MEMORY DEVICE

BACKGROUND OF THE INVENTION

1. Field of the Invention

This invention relates to a resistance change memory device, which stores a resistance value determinable by a resistance change of memory material in a non-volatile manner.

2. Description of the Related Art

EEPROM flash memories are known in the prior art as large capacitive and multi-functional non-volatile semiconductor memories. In this kind of semiconductor memories, miniaturized circuits with a minimal size of 100 nm or less has been achieved in the memory plane.

In order to further increase the memory capacity, it is required to further the miniaturization for increasing a cell number in a unit area. However, it is not easy to further carry forward the miniaturization.

Some approaches have been examined to increase the memory capacity without carrying forward the miniaturization such as, for example, to package plural memory chips as being stacked, or form a three-dimensional memory chip with memory cell arrays stacked above a silicon substrate, and so on.

However, conventionally proposed cell array stacking methods are such that planar cell arrays are simply stacked. In these cases, although N times capacity may be obtained by N layers stacking, cell accesses must be independently performed for the respective cell arrays. Therefore, it is not easy to access to plural cell arrays at a time.

As an advanced memory technology of the next generation in the future, there has been proposed a phase change memory which utilizes a phase transition between crystalline and amorphous states of a chalcogenide-based glass material (for example, see Jpn. J. Appl. Phys. Vol. 39 (2000) PP. 6157-6161 Part 1, NO. 11, November 2000 "Submicron Nonvolatile Memory Cell Based on Reversible Phase Transition in Chalcogenide Glasses" Kazuya Nakayama et al).

The memory of this type utilizes the fact that a resistance ratio of the amorphous state to the crystalline state of the chalcogenide is as large as 100:1 or more to store therein such different resistance value states as information. This phase change is reversible, and any change can be controlled by adequately designing the way of heating, wherein the heating technique is controllable by the amount of current flowing in this material.

In order to increase the capacity of such the phase change memory, how to integrally form a cell array and a read/write circuit thereof becomes an important technical issue. Additionally, how to design the read/write circuit capable to perform high-speed data input/output is also becomes an important technical issue.

SUMMARY OF THE INVENTION

A resistance change memory device in accordance with an aspect of the invention including:

a semiconductor substrate;

a plurality of cell arrays stacked above the semiconductor substrate, each cell array having memory cells arranged in a matrix manner, bit lines each commonly connecting one ends of plural memory cells arranged in a first direction of the matrix and word lines each commonly connecting the other ends of plural memory cells arranged in a second direction of the matrix;

a read/write circuit formed on the semiconductor substrate as underlying the cell arrays for reading and writing data of the cell arrays;

first and second vertical wirings disposed outside of first and second boundaries that define a cell layout region of the cell arrays in the first direction to connect the bit lines of the respective cell arrays to the read/write circuit; and third vertical wirings disposed outside of one of third and fourth boundaries that define the cell layout region in the second direction to connect the word lines of the respective cell arrays to the read/write circuit, wherein the memory cell includes a variable resistance element for storing as information a resistance value, and wherein the variable resistance element has:

a recording layer formed of a composite compound containing at least one transition element and a cavity site for housing a cation ion; and electrodes formed on the opposite sides of the recording layer, one of the electrodes serving as a cation source in a write or erase mode for supplying a cation to the recording layer to be housed in the cavity site therein.

BRIEF DESCRIPTION OF THE DRAWINGS

FIGS. 27 to 32 show compound examples usable in this embodiment.

DETAILED DESCRIPTION OF THE EMBODIMENTS

Figure 1:
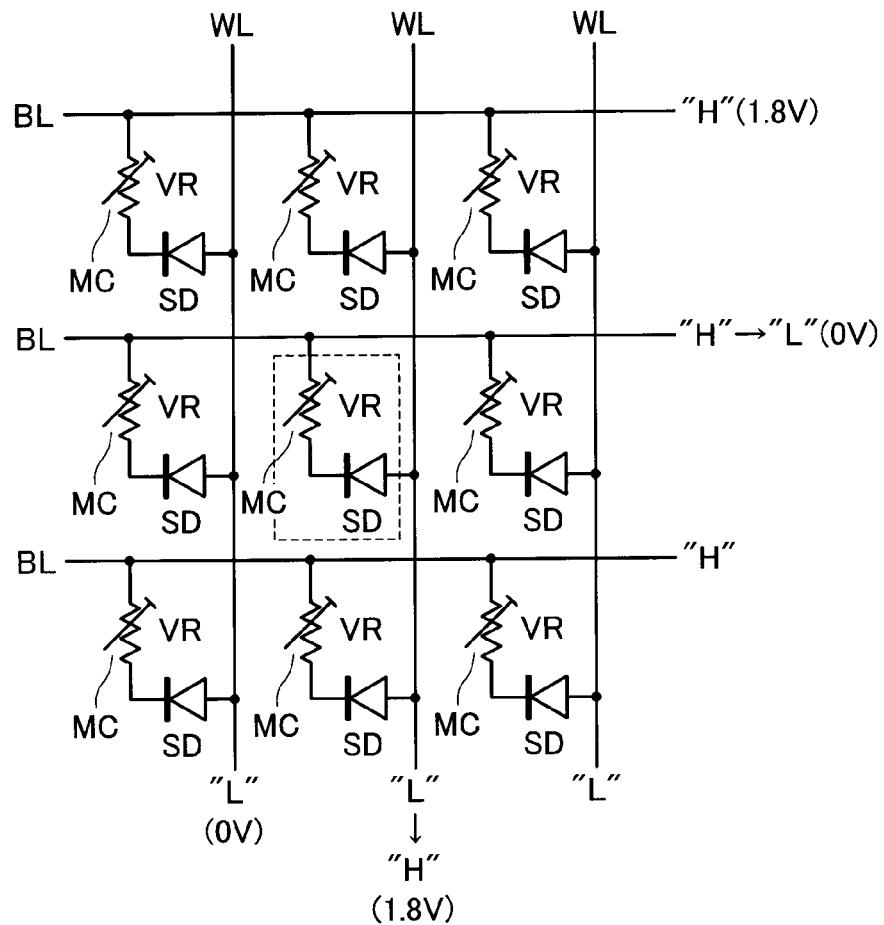
FIG. 1 is an equivalent circuit of a cell array in accordance with an embodiment of this invention.

Referring to the drawings, embodiments of this invention will be described bellow.

FIG. 1 shows a cell array of a phase change memory in accordance with an embodiment, with respect to a 3×3 cell matrix. A plurality of word lines WL are provided in parallel, and a plurality of bit lines BL are provided to cross the word lines WL.

Memory cells MC are laid out at the respective crossing points of these lines. The memory cell MC is a series-connection circuit of a variable resistive element VR and a diode SD. The variable resistive element VR is formed of chalcogenide and is operable to store therein a resistance value determined due to a phase transition between its crystalline and amorphous states as a binary data in a nonvolatile manner.

Although the diode SD is a Schottky diode in a preferable case of this embodiment, a PN-junction diode is alternatively usable. One end of the memory cell MC is connected to a bit line BL, and the other end is connected to a word line WL.

Although in the drawing the diode SD is such that the word line WL side is an anode, it is also possible to reverse the polarity of diode SD because what is required here is to obtain the cell selectivity based on a voltage potential relationship of the word line WL versus the bit line BL.

As previously stated, data is stored as the significance of a resistance value of the resistive element VR of each memory cell MC. For instance, in a non-select state, let all the word lines WL be set at "L" level while setting all the bit lines BL at "H" level. One example is that "H" level is equal to 1.8V and "L" is 0V. In this nonselect state, the diodes SD of all memory cells MC are in a reverse-bias state and thus are in an off-state; thus, no currents flow in the resistive elements VR.

Considering the case of selecting a centrally located memory cell MC of the cell array of FIG. 1, which is surrounded by broken lines, let a selected word line WL at "H" while setting a selected bit line BL at "L". Whereby, at the selected cell, its diode SD becomes forward-biased allowing a current to flow therein.

The amount of the current flowing in the selected cell at this time is determined by the phase of the chalcogenide constituting the resistive element VR; thus, it is possible to read two-value or binary data by detecting whether the current amount is large or small.

Also note that it is possible to permit creation of a phase transition in the chalcogenide of the resistive element VR by making higher the "H" level potential of the selected word line, or making lower the "L" level of the selected bit line than the read mode to thereby likewise increase the current amount and then utilizing the heat-up of a cell portion due to this current, by way of example. Thus, it is possible to select a specific cell in the cell array and then rewrite information of such cell.

In this way, in the cell array of this embodiment, access may be performed only by potential level setup of a single word line WL and a single bit line BL. Although, in the case of a transistor provided for cell selection, a signal line for selecting the gate of the transistor is required within the cell array, no such signal line is necessary in this embodiment.

In addition, in view of the fact that diodes are inherently simpler in structure than transistors, the cell array becomes more simplified in configuration owing to a decrease in requisite number of signal lines in combination with the simple diode structure advantage, thus enabling achievement of higher integration of the cells.

Although a basic cell array configuration is described above, a three-dimensional cell array structure, in which a plurality of cell arrays are stacked above a semiconductor substrate, is utilized in this embodiment. Such a three dimensional cell array will be explained below.

Figure 2:
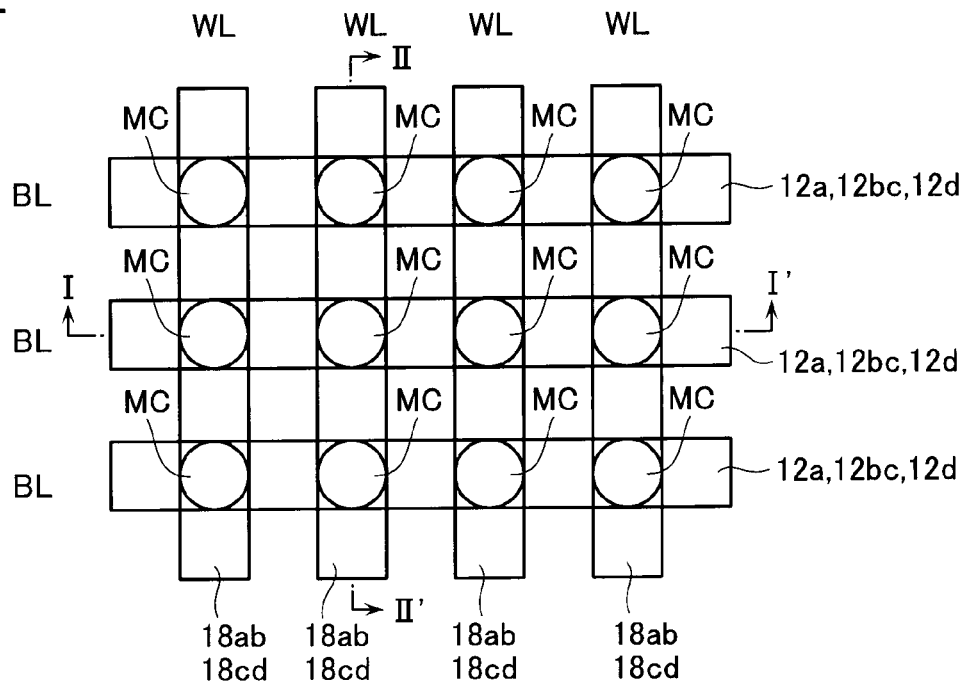
FIG. 2 is a plan view diagram of a four-layer stacked cell arrays.
Figure 3:
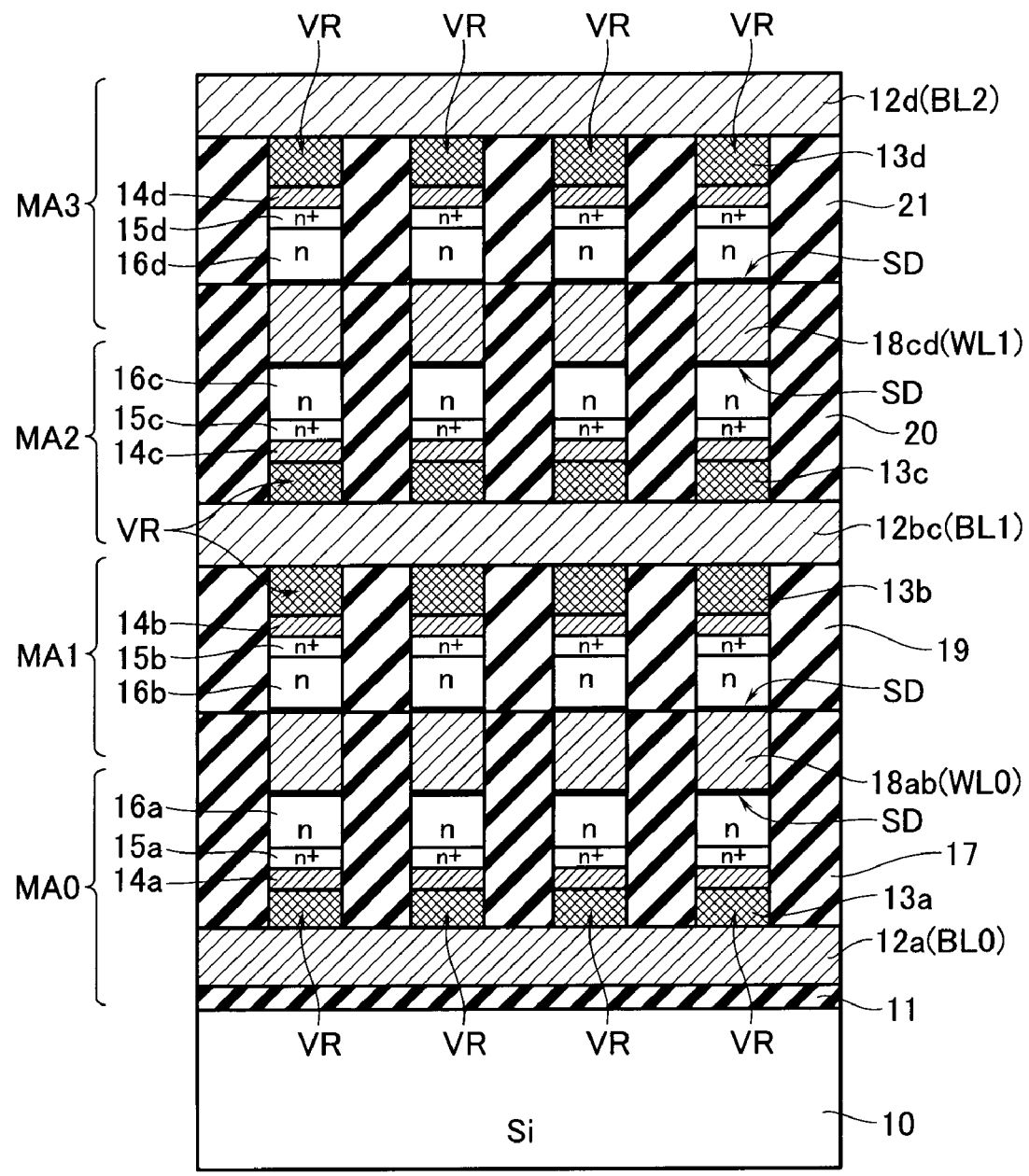
FIG. 3 is a cross-sectional diagram as taken along line I-I' of FIG. 2 in the case of that a Schottky diode is used in the memory cell.

FIGS. 2 and 3 shows a layout and a cross section along I-I' line thereof of a three-dimensional (3D) cell array including four-layer stacked cell arrays MA0 to MA3. In these figures, the same reference numerals are used at the same parts or components in the respective cell arrays, which numerals are distinguished between the cell arrays by addition of suffices "a", "b" thereto, and also distinguished between the shared portions of each two cell arrays by addition of suffices "ab", "bc" and "cd".

A silicon substrate 10 is covered with an insulator film such as a silicon dioxide film. Above the substrate, a plurality of bit lines (BL) 12a are arranged in parallel with each other. Pillar-type memory cells MC are arranged on each bit line 12a at a certain pitch, each of which has a variable resistive device VR formed of a chalcogenide layer 13a and a Shottky diode SD stacked thereon. Word lines (WL) 18ab are formed to commonly connect the upper ends of the memory cells MC in a direction perpendicular to the bit lines 12a, whereby first cell array MA0 is formed.

In detail, the memory cells MC are formed by patterning a laminated layers of the chalcogenide 13a, an ohmic electrode 14a, an n$^+$-type silicon layer 16a and an n-type silicon layer 16a. An interlayer dielectric film 17 is buried around the memory cells MC to planarize the cell array MA0.

It should be appreciated that a metal film may be formed for Shottky contacting to the n-type silicon layer 16a in addition to the word line 18ab for forming a more preferable Shottky diode.

Second cell array MA1 is formed to share the word lines (WL0) 18ab with the first cell array MA0. In detail, pillar-type memory cells MC are arranged on each word line 18ab at a certain pitch, each of which has a Shottky diode SD and a variable resistive device VR formed of a chalcogenide layer 13a stacked thereon, by patterning the laminated films of an n-type silicon film 16b, an n$^+$-type silicon film 15b, an ohmic electrode 14b and a chalcogenide film 13b.

The cell layout is the same as that of the first cell array MA0. A Shottky junction is formed between the word line 18ab and the n-type silicon 16b. Bit lines (BL1) 12ab are patterned to commonly connect the chalcogenide layers 13b arranged along a direction perpendicular to the word lines 18ab. An interlayer dielectric film 19 is buried around the memory cells MC to planarize the cell array MA1.

The stacked structure of third and fourth cell arrays MA2 and MA3 is periodically formed as similar to the first and second cell arrays MA0 and MA1. Bit lines (BL1) 12bc are shared between the second cell array MA1 and the third cell array MA2. The third cell array MA2 and the fourth cell array MA3 shares the word lines (WL1) 18cd with each other. Bit lines (BL0) 12a of the lowest cell array MA0 and bit lines (BL3) 12d of the uppermost cell array MA3 are independently prepared, respectively.

As previously described, a PN junction diode may be used in place of the Shottky diode for constituting the memory cell MC.

Figure 4:
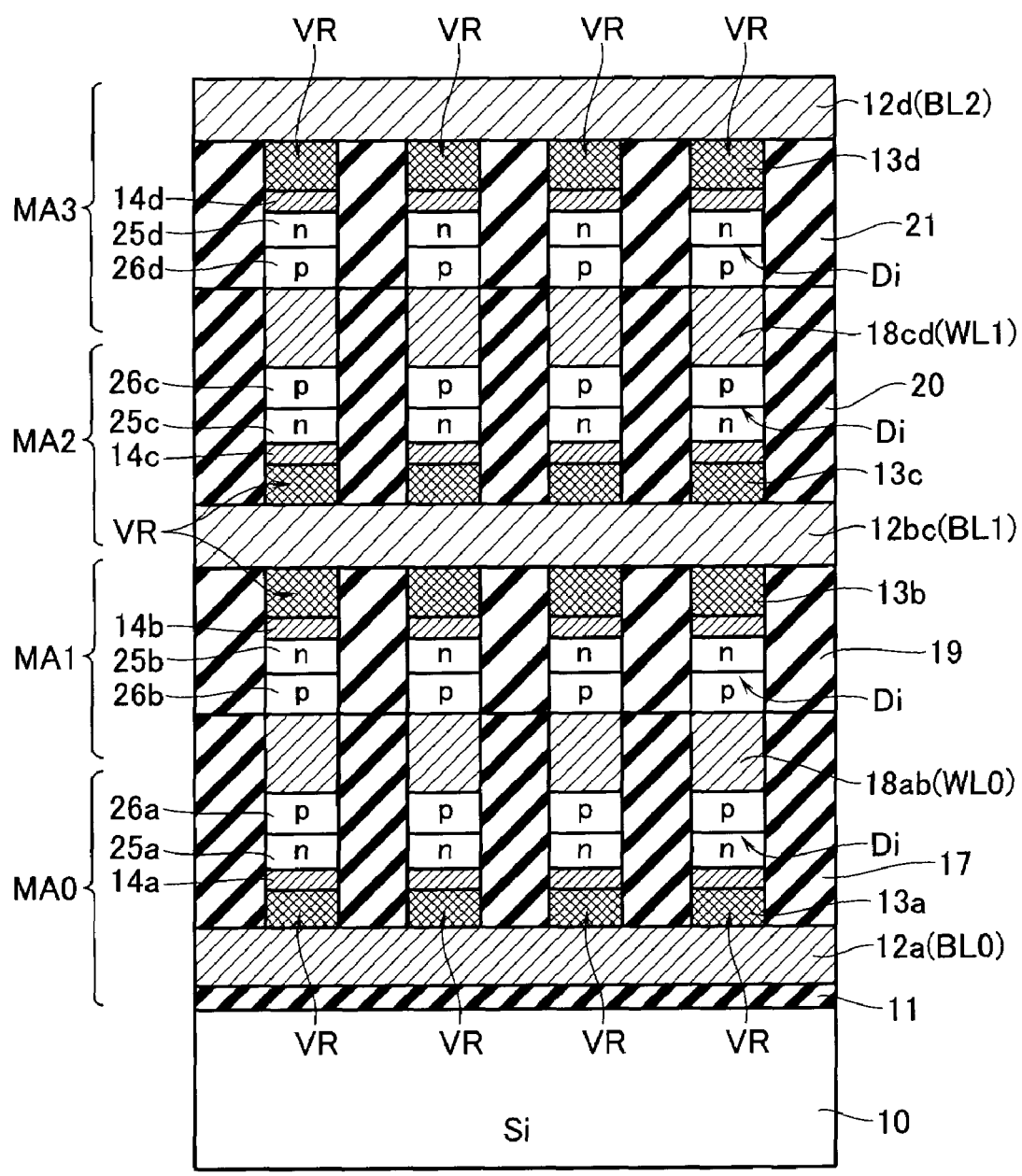
FIG. 4 is a cross-sectional diagram as taken along line I-I' of FIG. 2 in the case of that a PN junction diode is used in the memory cell.

In correspondence to FIG. 3, another 3D cell array having PN junction diodes Di are illustrated in FIG. 4. As shown in FIG. 4, in each of the memory cells arranged between the bit lines and word lines, a PN junction diode Di is formed of an n-type silicon layer 25 and a p-type silicon layer 26. Others are similar to that of FIG. 3.

Figure 5:
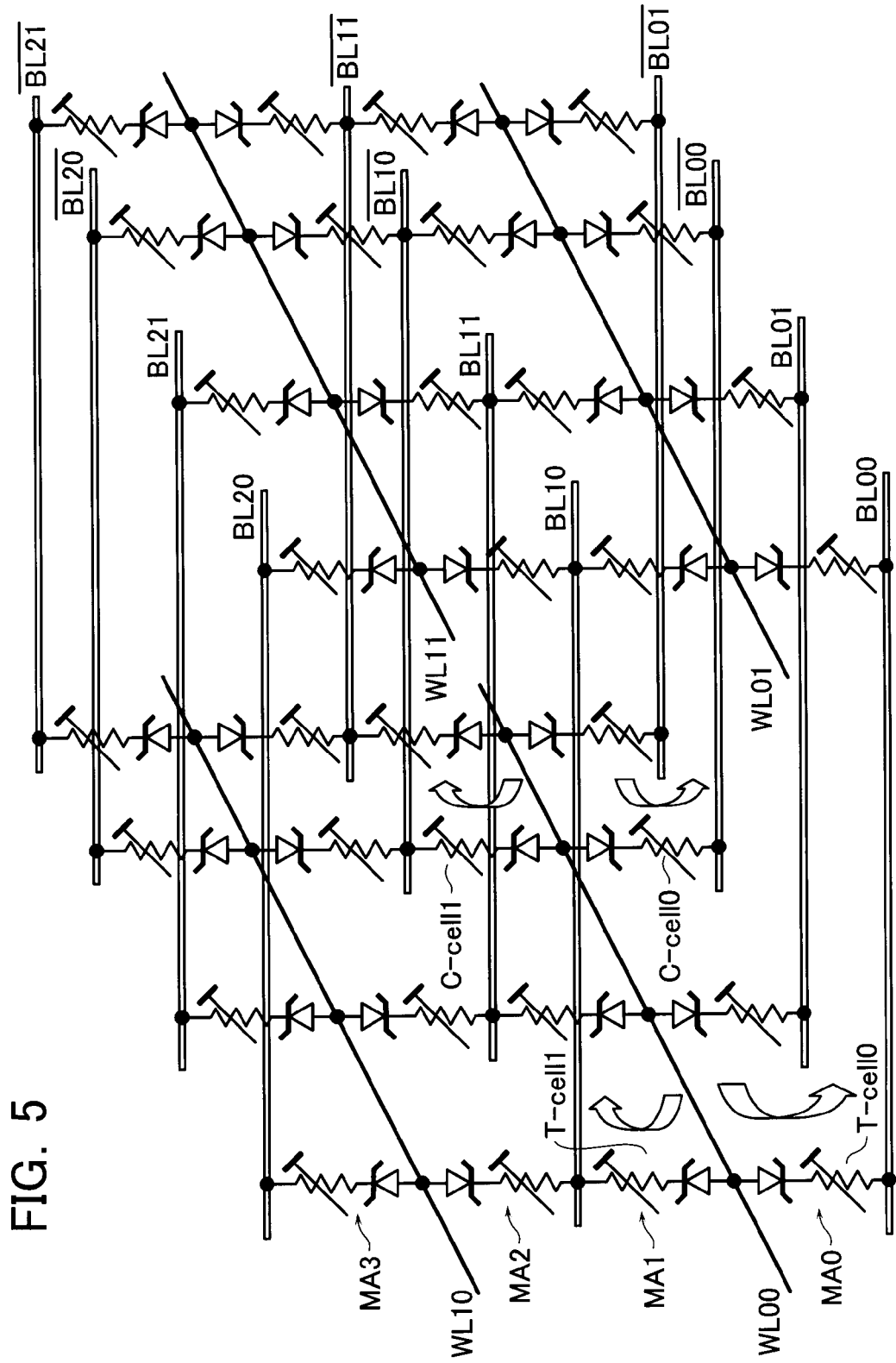
FIG. 5 is a three-dimensional equivalent circuit of the cell array.

FIG. 5 shows a three-dimensional equivalent circuit of the 3D cell array formed as above-described. In order to prevent the bit lines from mutual interference, each two bit lines constitute a pair, and another bit line is disposed between the pair of bit lines.

BL00, /BL00, BL01, /BL01, . . . are bit line pairs of the first cell array MA0; BL10, /BL10, BL11, /BL11, . . . are shared bit line pairs between the second and third cell array MA1 and MA2; and BL20, /BL20, BL21, /BL21, . . . are shared bit line pairs between the third and fourth cell array MA2 and MA3 .

Further, WL0 (WL00, WL01, . . . ) are shared word lines between the first and second cell arrays MA0 and MA1; and WL1 (WL10, WL11, . . . ) are shared word lines between the third and fourth cell arrays MA2 and MA3 .

In the above-described 3D cell array in which many phase-change memory cells are integrated, variation of cell characteristics gets into trouble. In detail, a data state of a cell that uses chalcogenide's phase-transition is varied due to a history thereof, environment and the like.

For example, a data "0" (high resistive state) is written by making the chalcogenide layer amorphous-rich, whereas a data "1" data (low resistive state) is written by making the chalcogenide layer crystalline-rich. In this case, the initial states of the respective cells are different from each other due to histories and positions thereof.

In consideration of the above-described view points, in this embodiment, nearly disposed two cells constitute a pair cell for storing complementary data therein in such a manner that data "0" is stored in one cell and data "1" is stored in the other cell. Read operation is done by detecting the difference between cell currents of the two cells constituting a pair.

By use of this method, even if there is a partial overlap between the high resistive state distribution and the low resistive distribution in the entire 3D cell array, it is possible to precisely read/write the cell data.

In FIG. 5, two cell pairs are typically shown as follows: two cells connected to a pair of bit lines BL00 and /BL00, respectively, with sharing a word line WL00 in the cell array MA0, being constituted to one pair cell, one of which is a true cell "T-cell0" and the other is a complementary cell "C-cell0"; and two cells connected to a pair of bit lines BL10 and /BL10, respectively, with sharing a word line WL10 in the cell array MA1, being constituted to another pair cell, one of which is a true cell T-cell1 and the other is a complementary cell C-cell1.

In every pairs of cells, a positive logic value of a binary data is stored in the true cell, and a negative logic value is stored in the complementary cell. Similar pair cells are selected in the cell arrays MA2 and MA3, too. In FIG. 5, cell currents at the respective selection times are shown by arrows.

Up to the present, a cell array configuration has been described. In this invention, a read/write circuit is previously formed for reading and writing (or programming) cell data on the silicon substrate 10, above which the above-described 3D cell array is to be formed. In detail, the 3D cell array is formed to be stacked above the read/write circuit.

Figure 6:
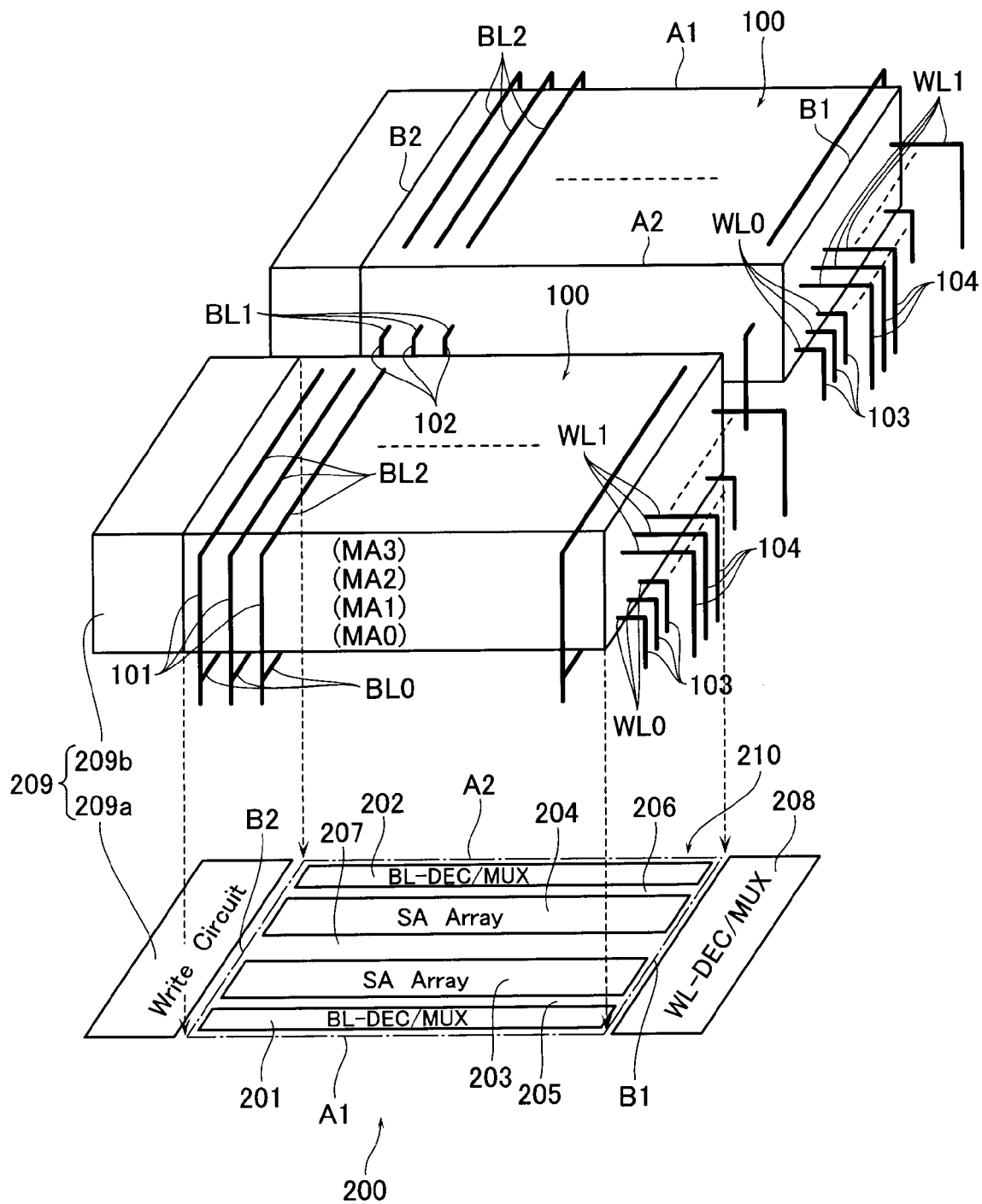
FIG. 6 is a perspective view showing a layout relationship of cell blocks and a read/write circuit thereof.

FIG. 6 is a schematic perspective view showing a stacking state of cell blocks 100 and a read/write circuit 200 and interconnection relationships therebetween. Each the cell block 100 corresponds to the above-described 3D cell array. That is, a 3D cell array is, when necessary, divided into a plurality of cell blocks 100 with a predetermined capacity. In FIG. 6, two cell blocks 100 are arranged in a direction along the bit lines.

As shown in FIG. 6, the read/write circuit 200, which is used for data reading and writing the cell block 100, is underlain the cell block 100.

The read/write circuit 200 is formed in such a state that main portion thereof is disposed within a rectangular cell layout region 210 defined on the substrate 10, above which the cell block 100 is stacked. The cell layout region 210 is defined by two boundaries A1 and A2 in a direction along the bit lines, and by two boundaries B1 and B2 in a direction along the word lines.

A group of bit lines BL0 of the first cell array MA0 and a group of bit lines BL2 of the fourth cell array MA3 are drawn to the first boundary A1 side to be connected to a bit line select circuit 201, which is disposed along the boundary A1 in the read/write circuit 200, through vertical wirings (i.e., passages that vertically run to the substrate) 101 that are disposed along the boundary A1.

A group of bit lines BL1 shared by the second and third cell arrays MA1 and MA2 are drawn to the second boundary A2 side to be connected to another bit line select circuit 202, which is disposed along the boundary A2 in the read/write circuit 200, through vertical wirings 102 that are disposed along the second boundary A2.

The reason why the bit lines BL0 and BL2 are drawn to the same side to be commonly connected to the bit line select circuit 201 through the vertical wirings 101 is in such a fact that these groups of bit lines are not simultaneously activated. In detail, cell arrays MA0 and MA1 are simultaneously activated because of these have shared word lines WL0.

As similar to this, cell arrays MA2 and MA3 are simultaneously activated because of these have shared the word lines WL1. However, since the cell arrays MA2 and MA3 share the bit lines BL1, the lower cell arrays (MA1, MA2) and the upper cell arrays (MA2, MA3) are not activated simultaneously. The bit line select circuit 201, 202 include bit line decoders/multiplexers (BL-DEC/MUX).

The word lines WL0 and WL1 are drawn to the third boundary B1 side to be connected to word line select circuit 208, which is disposed along the boundary B1 in the read/write circuit 200, through vertical wirings 103 and 104, respectively, that are disposed along the boundary B1. The word line select circuit 208 has word line decoders/multiplexers (WL-DEC/MUX).

A central portion of the read/write circuit 200 serves as a global bus region 207, in which I/O data lines and write pulse signal lines are disposed crossing this region in the direction along the word lines. Between this global bus region 207 and the bit line select circuits 201 and 202, disposed are sense amplifier arrays 203 and 204, respectively. Signal lines formed at the global bus region 207 are shared by the sense amplifier arrays 203 and 204.

The sense amplifiers in the sense amplifier arrays 203 and 204 are connected to bit line select circuits 201 and 202 through signal lines disposed at local bus regions 205 and 206, respectively. Therefore, some ones selected from the bit lines BL0 or BL2 by the bit line select circuit 201 are connected to the sense amp array 203. Similarly, some ones selected from the bit lines BL1 by the bit line select circuit 202 are connected to the sense amp array 204.

The I/O data lines and write pulse signal lines disposed at the global bus region 207 are drawn to the fourth boundary B2 side of the cell layout region 210. Along this boundary B2, disposed is a write circuit 209 for applying write pulses to selected cells.

The write circuit 209 includes, as described bellow, a transistor circuit 209a formed on the silicon substrate 10 and a diode circuit 209b formed above the substrate by use of the same steps of cell array forming.

As above-described referring to FIG. 6, bit lines and word line of the cell array are connected to the read/write circuit 200 formed on the substrate 10 through the vertical interconnection lines 101 to 104. Practically, these interconnections 101 to 104 are contact plugs buried in interlayer dielectric films formed surrounding the cell array. The structural examples of the interconnections are shown in FIGS. 7 and 8.

Figure 7:
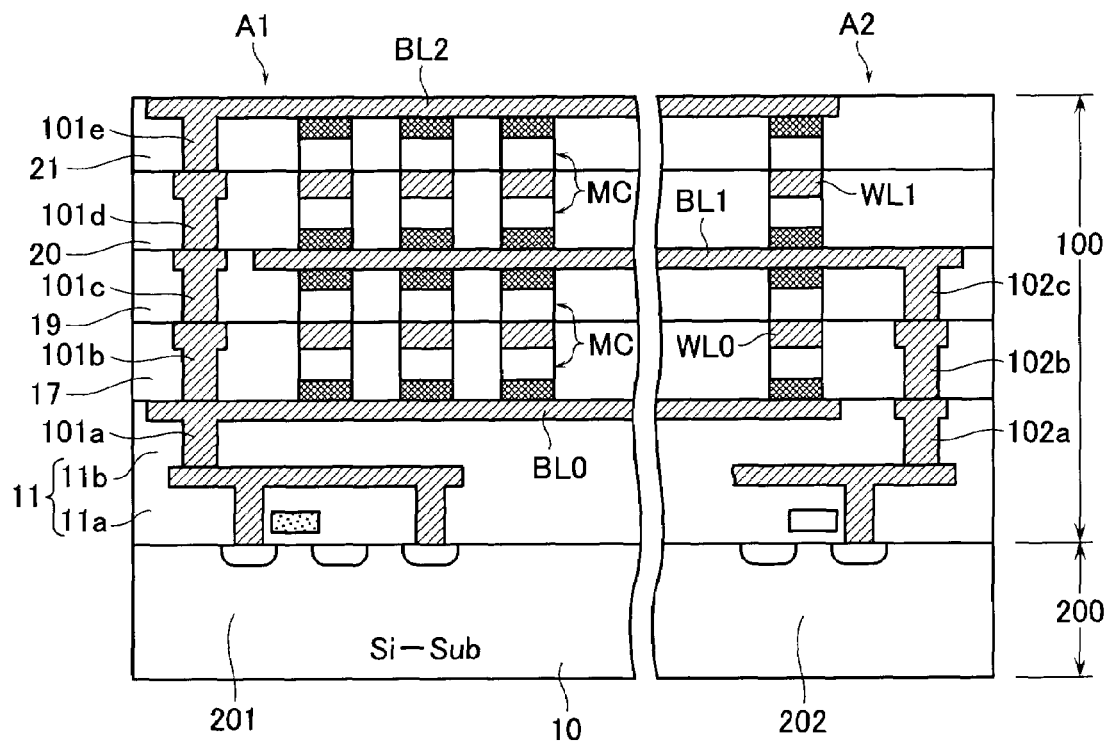
FIG. 7 is a cross-sectional diagram showing the interconnection relationship between bit lines and the read/write circuit.

FIG. 7 shows a connection state between the bit lines and the read/write circuit 200 on a cross-section along the bit lines of the cell array. FIG. 8 shows a connection state between the word lines and the read/write circuit 200 on a cross-section along the word lines of the cell array.

Figure 8:
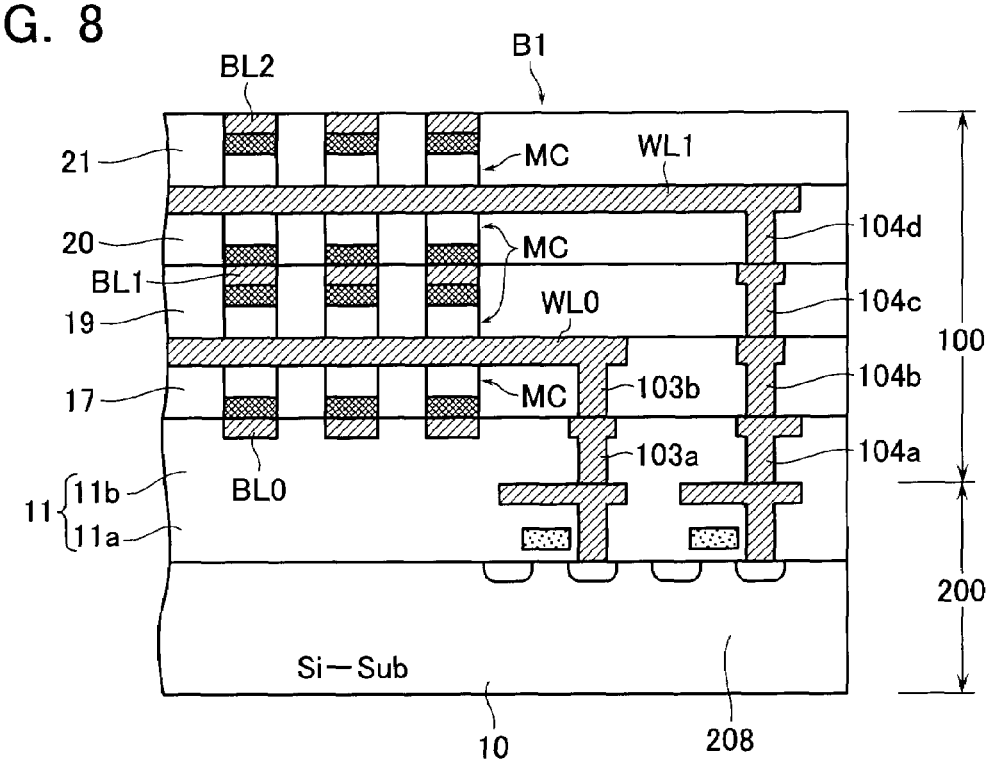
FIG. 8 is a cross-sectional diagram showing the relationship between word lines and the read/write circuit.

As shown in FIGS. 7 and 8, the read/write circuit 200 has necessary transistors and metal interconnections formed on an interlayer dielectric film 11a covering the transistors. The read/write circuit 200 is covered by an interlayer dielectric film 11b, and the four layered cell arrays are formed thereon. Therefore, the interlayer dielectric films 11a and 11b constitute the insulator film 11 shown in FIGS. 3 and 4.

As shown in FIG. 7, the vertical wirings 101, which are used to connect the bit lines BL0, BL2 drawn toward the boundary A1 of the cell layout region 210 to the bit line select circuit 201, are composed of contact plugs 101a to 101e buried in the interlayer dielectric films 17, 19, 20 and 21. Similarly, the vertical wirings 102, which are used to connect the bit lines BL1 drawn toward the boundary A2 of the cell layout region to the bit line select circuit 202, are composed of contact plugs 102a to 102c buried in the interlayer dielectric films 11, 17 and 19.

As shown in FIG. 8, the vertical wirings 103, which are used to connect the word lines WL0 drawn toward the boundary B1 of the cell layout region to the word line select circuit 208, are composed of contact plugs 103a and 103b buried in the interlayer dielectric films 11 and 17. The vertical wirings 104, which are used to connect the word lines WL1 drawn toward the same side as the word lines WL0 to the word line select circuit 208, are composed of contact plugs 104a to 104d buried in the interlayer dielectric films 11, 17 and 20.

Although the lowest contact plugs 101a, 102a, 103a and 104a of the laminated cell arrays in FIGS. 7 and 8 are connected to metal wirings of the read/write circuit 200, it is possible to directly connect these to source/drain diffusion layers of transistors.

FIGS. 7 and 8 shows an example in which the contact plugs are formed of metal film used for bit lines and word lines.

The fabrication steps will be described bellow. Additionally, it is appreciated that the contact plugs may be formed of other metal films different from the bit lines and word lines or polycrystalline silicon films.

One cell block 100 in FIG. 6 includes, for example, 512 bit lines (BL) and 128 word lines (WL) for one cell array. As described above, two memory cells store one bit data in this embodiment. In this case, one cell block has a memory space of 256 columns (Col)×128 rows(Row). The memory capacity can be increased by increasing the number of cell blocks to be arranged.

Figure 9:
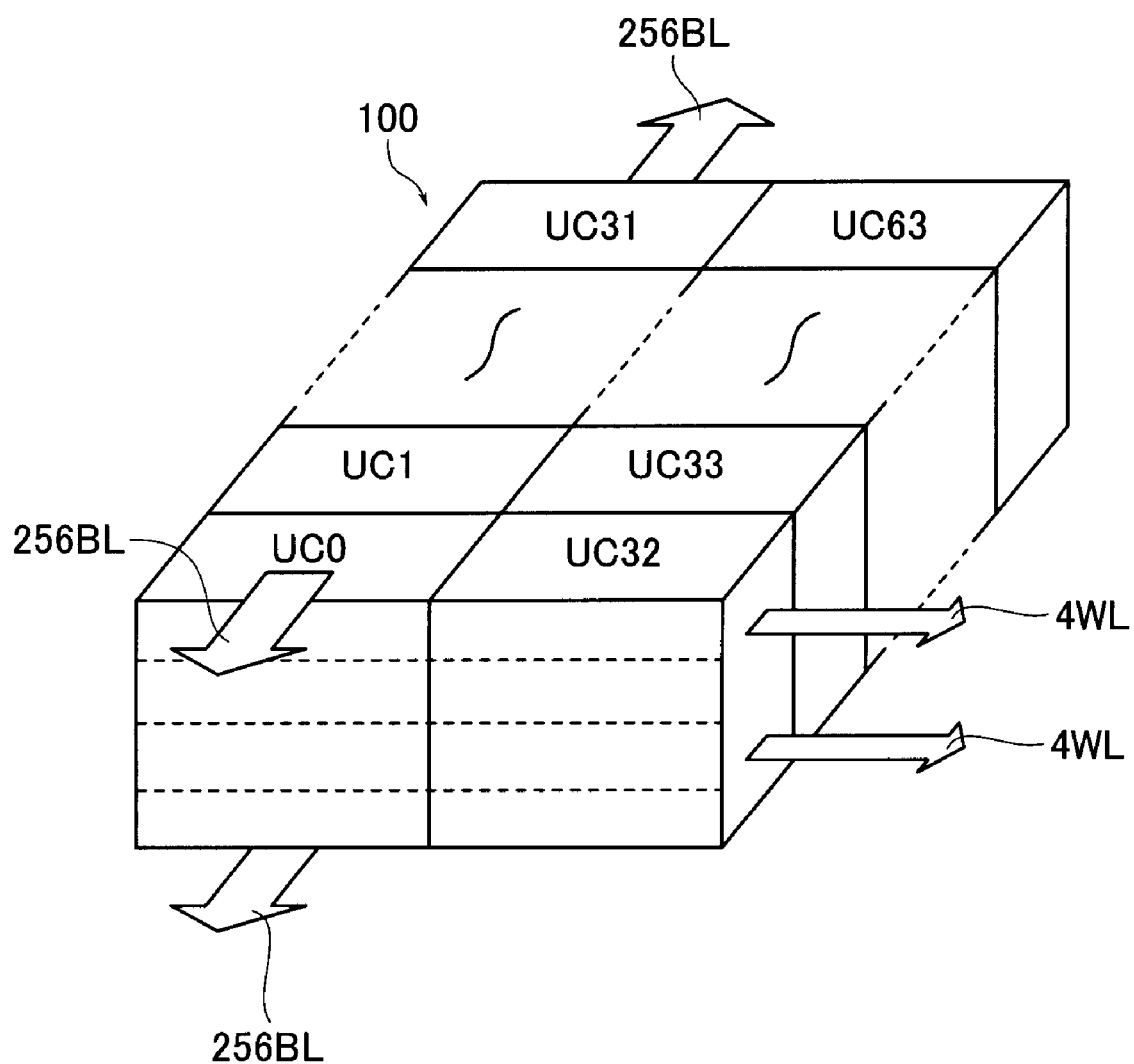
FIG. 9 is a diagram showing a unit configuration of the four-layer stacked cell arrays.

In order to achieve high-speed access in such a large capacitive memory, it is necessary to perform parallel access for multi-bit data. For example, in order to perform 32-bits parallel access, one cell block is, as shown in FIG. 9, to be divided into two parts in the word line direction, and into 32 parts in the bit line direction, whereby 64 cell units UC (UC0 to UC63) blocks are obtained.

As a result, each cell unit UC becomes to have a capacity of 32IO×4Col×4 Row×4. On the global bus region 207, data lines and write pulse signal lines are disposed for 64IO data input/output.

Figure 10:
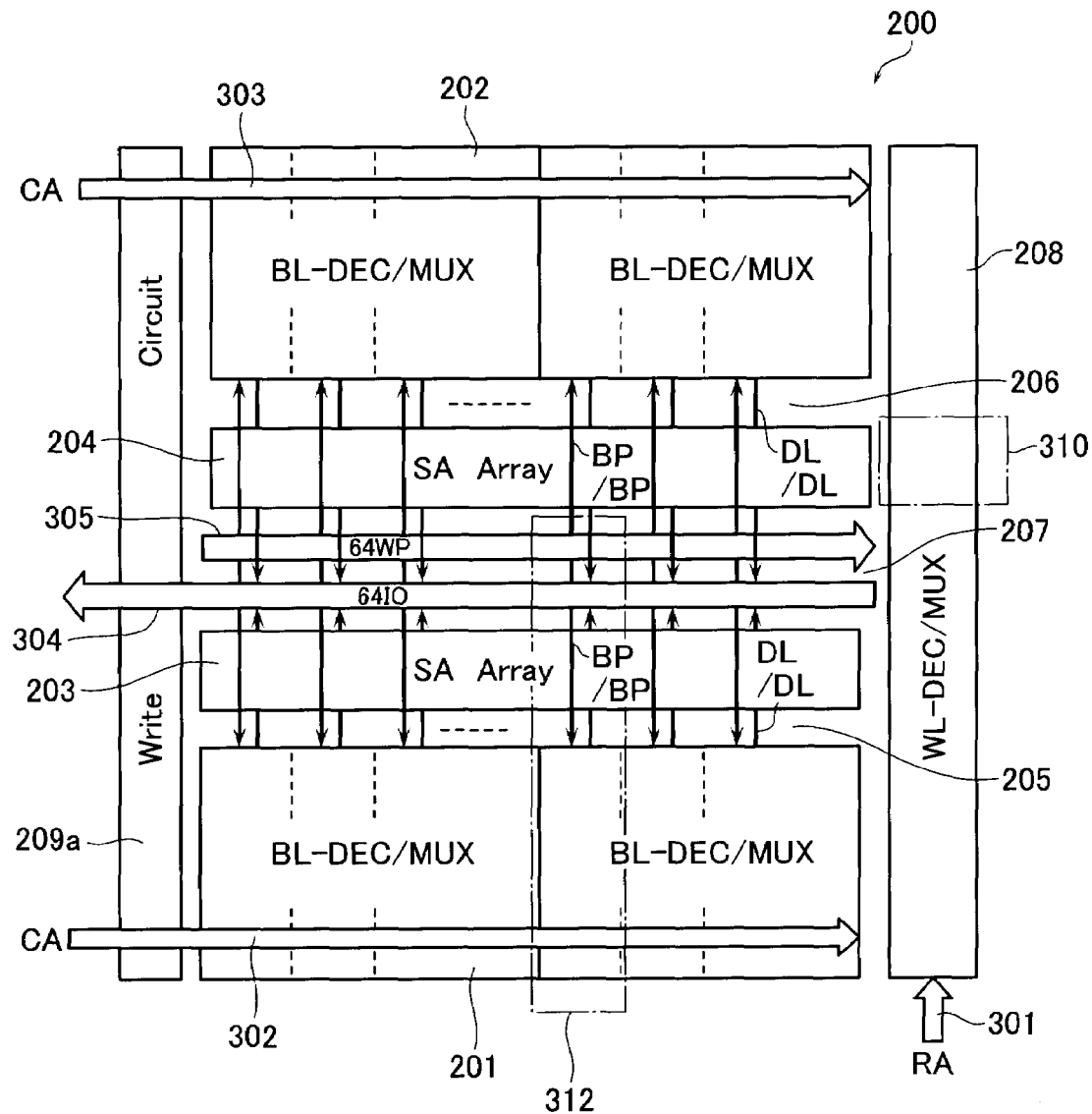
FIG. 10 shows a layout of the read/write circuit.

FIG. 10 shows a schematic layout of the read/write circuit 200 with respect to one cell block 100 in FIG. 6 in a case that the above-described cell block construction is used. On the word line select circuit (WL-DEC/MUX) 208 as been disposed at the right side in FIG. 10, disposed are row address (RA) signal lines 301, which vertically run for selecting one each (i.e., upper and lower ones) from 128×2 word lines in the cell block 100.

The write circuit 209 disposed at the left side in FIG. 10 output write pulses that are supplied to selected bit lines in a write mode. Write pulse signal lines (WP) 305 which transfer the write pulses are disposed as to laterally run on the global bus region 207. In parallel with the write pulse signal lines 305 on the global bus region 207, disposed are main data lines 304, on which read out data are transferred.

One cell unit is selected in one cell block, and cell data of adjacent two layers in each cell unit are simultaneously activated. Therefore, data lines 304 are prepared for 32IO× 2=64IO. The write pulse signal lines are the same.

On the lower and upper ends of the read/write circuit 200, disposed are the bit line select circuits 201 and 202, respectively, and column address (CA) signal lines 302 and 303 are disposed to laterally run on the respective regions. One of the bit line select circuits, i.e., circuit 201, selects 32 bit line pairs from 512 bit line pairs (=64IO×4 Col) in the upper two cell arrays, and the other selects 32 bit line pairs from 512 bit line pairs in the lower two cell arrays.

Therefore, on the respective local bus regions 205 and 206, disposed are four pairs of current pass lines BP, /BP for commonly 4-columns (=8 bit lines) data as to cross the regions of sense amplifier arrays 203 and 204 for applying the write pulses of the write pulse signal lines 305 to bit lines selected by the respective bit line select circuits 201 and 202. Additionally, 64 pairs of local data lines DL, /DL for 4 columns data are disposed on the respective local bus regions 205 and 207, and these are connected to the respective sense amps in the sense amplifier arrays 203 and 204.

Figure 11:
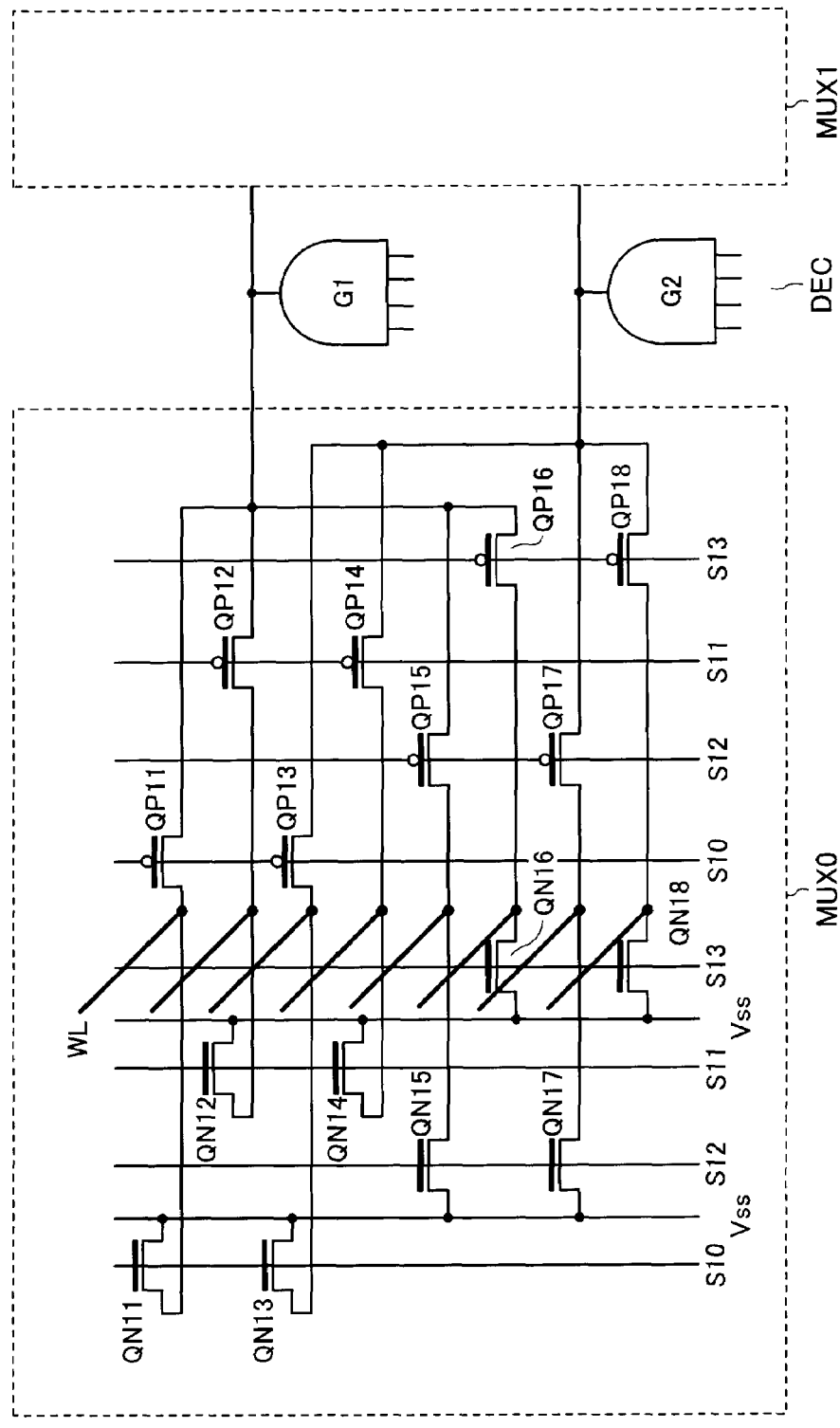
FIG. 11 is a diagram showing the word line select circuit portion.
Figure 12:
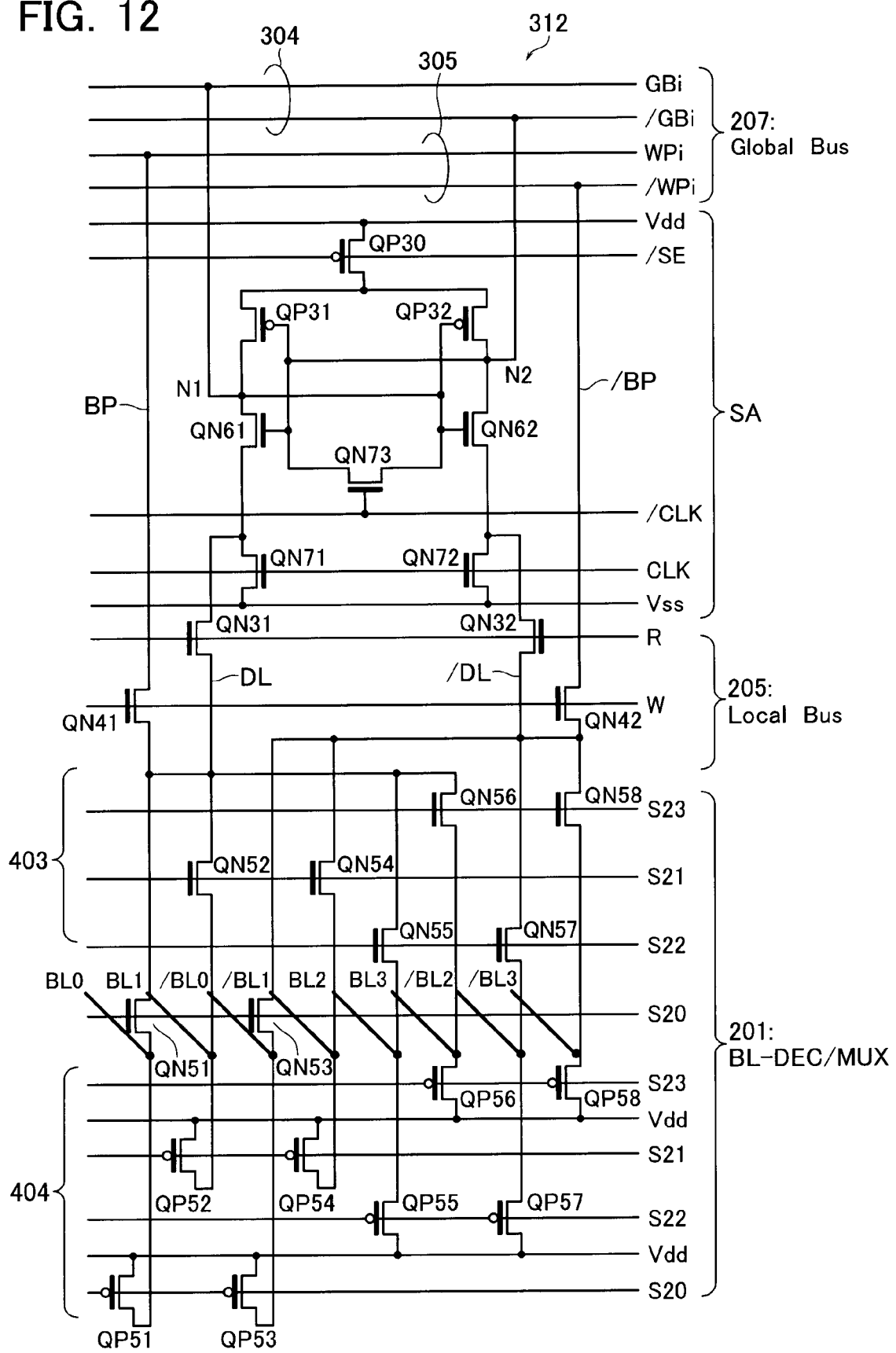
FIG. 12 is a diagram showing the bit line select circuit portion.

One circuit portion 310, that are to be connected to 4 Row×2 (=8 word lines) and another circuit portion 312, that are to be connected to 4 Col (=8 bit lines), each being surrounded by a broken line in FIG. 10, are shown in FIGS. 11 and 12, respectively, in detail.

Two multiplexers MUX0 and MUX1 are select gate circuits for selecting lower word lines WL0 shared by the cell arrays MA0 and MA1, and upper word lines WL1 shared by the cell arrays MA2 and MA3, respectively. Eight word lines input to the multiplexer MUX0 correspond to the lower word lines for two cell units in FIG. 9.

Decoder DEC is composed of decode gates G (G1, G2, . . . ) for selecting one of 32 cell units. The multiplexer MUX0 has a select gate circuit 401 composed of PMOS transistors QP (QP11 to QP14, QP15 to QP18, . . . ) that are driven by select signals S10 to S13 so as to select one from four word lines.

A high level voltage (positive logic pulse) is applied to a selected word line for forward-biasing the cell diode together with a selected bit line. The multiplexer MUX0 has a reset circuit 402 composed of NMOS transistors QN (QN11 to QN14, QN15 to QN18, . . . ) for holding non-selected word lines as being at low level Vss. The multiplexer MUX1 is composed as similar to the multiplexer MUX0.

A sense amp SA shown in FIG. 12 is one of 32 sense amps in the sense amp array 205 shown in FIG. 10. Four pairs of eight bit lines BL0, /BL0 to BL3, /BL3 connected to the sense amp SA are ones selected from the bit line group BL0 or BL2 shown in FIG. 6.

As previously described, since the lower two cell arrays MA0 and MA1 and the upper two cell arrays MA2 and MA3 are not activated at a time, the sense amplifier SA is commonly used for the lower cell arrays MA0, MA1 and the upper cell arrays MA2, MA3 .

The sense amplifier SA is a CMOS flip-flop type current sensing amplifier with an activating PMOS transistor QP30. Two nodes N1 and N2 thereof are directly connected to a pair of ones GBi, /GBi in the global data lines 304, respectively.

Drains of sensing NMOS transistors QN61 and QN62 are selectively connected to data lines DL and /DL through NMOS transistors QN31 and QN32, respectively, that are controlled by a read control signal R to turn-on during a read operation. At the beginning of data sensing operation, nodes N1 and N2 are connected each other through transistor QN73. After when cell currents are transferred to the sensing transistors QN61 and QN62, drains thereof are clamped to Vss via NMOS transistors QN71 and QN72 that are controlled by a clock CLK to turn-on. The data lines DL, /DL are connected to a pair of bit lines selected by bit line decoder/multiplexer (BL-DEC/MUX).

The bit line decoder/multiplexer BL-DEC/MUX has a select gate 403 composed of NMOS transistors QN51 to QN54, and Q55 to Q58 controlled by decoded signals S20 to S23 for selecting one pair from four pairs of bit lines to connect these to the data lines DL and /DL, respectively. Additionally, the bit line decoder/multiplexer BL-DEC/MUX has a reset circuit 404 composed of PMOS transistors QP51 to QP54, and QP55 to QP58 for holding non-selected bit lines as being at a high level of Vdd.

The pair of data lines DL, /DL are connected to a pair of signal lines WPi, /WPi in the write pulse signal lines 305 through NMOS transistors QN41, QN42 that are driven by a write control signal W to turn-on, and through signal lines BP, /BP during a data read operation.

In the above-described configuration, when a data read operation is performed, word lines selected by select gate circuit 403 become "H", and bit line pairs selected by select gate circuit 403 become "L". At this time, cell currents from the selected complementary cells on the selected bit line pair are transferred to the drains of NMOS transistors of the sense amp SA through data lines DL, /DL and through NMOS transistors QN31, QN32.

During this operation, NMOS transistors QN71, QN72 are held at off-state. Thereafter, clock CLK becomes "H" to turn-on the NMOS transistors QN71, QN72, whereby the drains of the sensing NMOS transistors QN61, QN62 are clamped at Vss. As a result, a differential voltage generated between the nodes N1 and N2 due to the difference of cell currents is positively fed back, thereby amplifying one node to Vdd while the other to Vss. Amplified cell data as above-described is output to the main data lines GBi, /GBi.

In a data write mode, a positive logic write pulse with a level of Vdd is applied to a selective word line. Simultaneously, negative logic write pulses with a level of Vss or a boosted level are applied to selected bit line pair through the write pulse signal lines WPi, /WPi.

These positive and negative logic write pulses are controlled to have a certain overlap state therebetween and levels thereof corresponding to-be-written data, and applied to selected complementary cells, whereby a write operation is done. The write circuit and operations thereof will be described in detail later.

Since one word line is commonly connected to many pair cells, it is required for the word line to supply a large current to the pair cells. In consideration of such the current value, it is required to design drivability of the word line decoder, resistance of the word line it self, the transistor size, and the like.

It should be appreciated that the word line multiplexer MUX0 for eight word lines shown in FIG. 11 and the bit line decoder/multiplexer DEC/MUX for eight bit lines shown in FIG. 12 have the same circuit configuration. Therefore, these circuit regions may be achieved to have the same layout as shown in FIG. 13.

Figure 13:
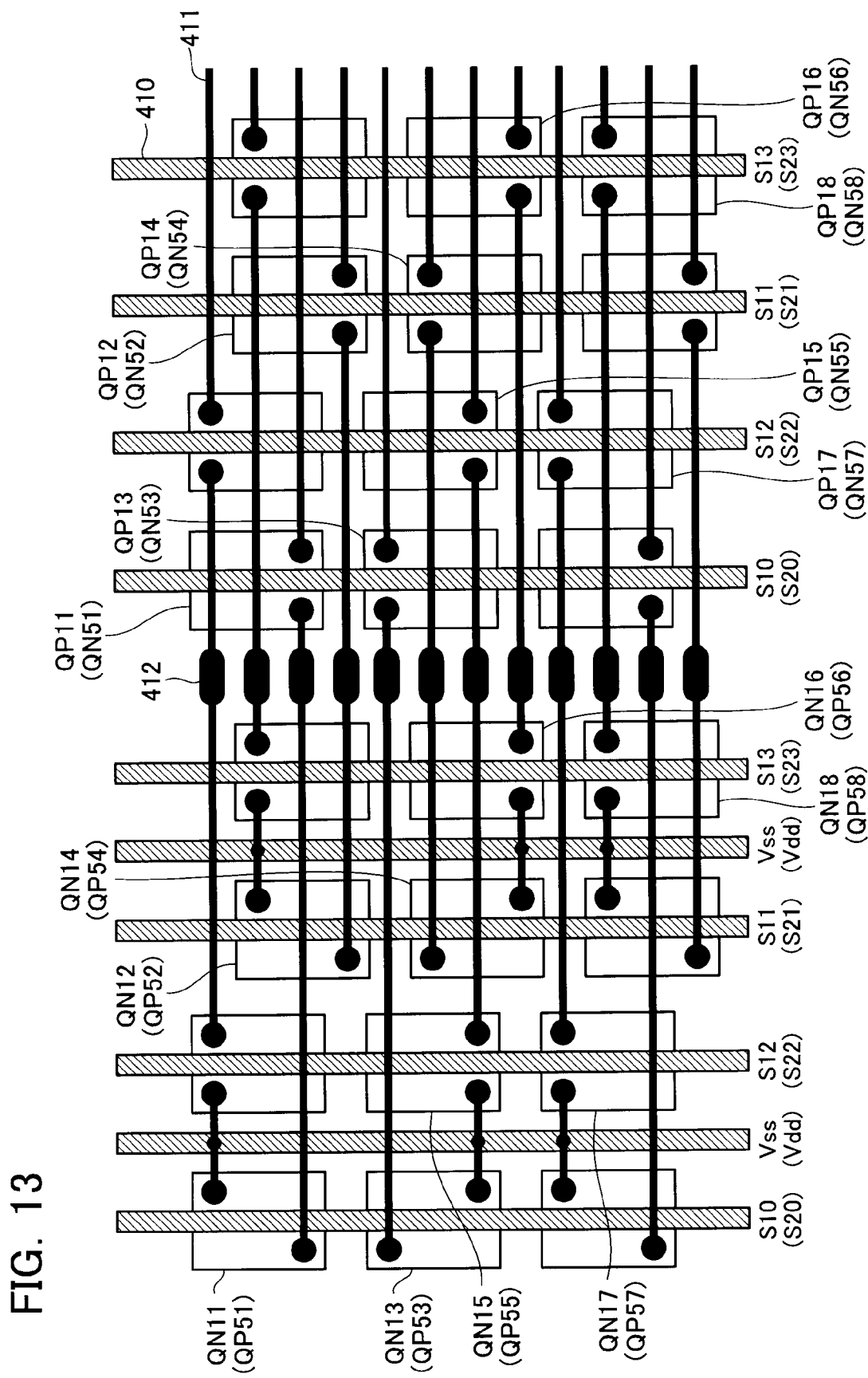
FIG. 13 is a diagram showing a layout of the word line select circuit portion and the bit line select circuit portion.

In FIG. 13, transistors QP11 to QP18, QN11 to QN18, select signals S10 to S13 and low level power supply Vss in the circuit of FIG. 11 are shown, and in correspondence to these, transistors QN51 to QN58, QP51 to QP58, select signals S20 to S23 and high level power supply Vdd in the circuit of FIG. 12 are shown parenthesized. Although the respective transistors corresponding to each other are of different conductivity-types, it is possible to use the same layout for these circuits.

Vertically running wiring 410 in FIG. 13 are gate lines of transistors that serve as select lines and power supply lines of Vdd, Vss. These may be simultaneously formed by patterning a polysilicon film. Since power supply lines Vss, Vdd are merely required to be potentially fixed as necessary for holding non-selected bit lines and word lines as being not floating, it is not required that these are low resistive. Therefore, it is able to use for these lines the same polysilicon film used for gate electrodes.

Although laterally running wirings 411 are shown by schematic straight lines, these are metal wirings which are contacted to sources and drains of transistors. Contact portions 412 serve as to connect the metal wirings 411 to bit lines and word lines, to which the vertical interconnection lines (i.e., contact plugs) 101 to 104 shown in FIG. 6 are connected.

Bit lines and word lines in the above-described cell array are preferably formed with a line/space of 1F/1F (F: minimum device-feature size). These bit lines and word lines are connected while holding the line pitch to the read/write circuit 200 on the substrate as shown in FIG. 6. In this case, the metal wirings 411 shown in FIG. 13 are formed to have the same line/space of 1F/1F .

Contrary to this, transistors disposed on the way of the metal wirings 411 must have a large area necessary for supplying a required current. In consideration to this view point, in FIG. 13, each transistor is formed to have a gate width of three pitches of the metal wirings 411.

When the transistor size and metal wire pitch are determined as above-described, in order to effectively dispose the transistors, the select signal lines S10(S20), S11(S21), S12(S22) and S13(S23) which are suffixed in accordance with an address order of 0, 1, 2 and 3 are arranged in such an order of S10(S20), S12(S22), S11(S21) and S13(S23).

As a result, between a transistor array of QP11(QN51), QP13(QN53) selected by the select signal line S10(S20) and a transistor array of QP12(QN52), QP14(QN54) selected by the select signal line S11(S21), disposed a transistor array of QP15(QN55), QP17(QN57) selected by the select signal line S12(S22). By employing such the transistor arrangement, it is possible to dispose transistors with a large size within a metal wiring area in which wirings are arranged at a small pitch without idle spaces.

Next, referring to FIGS. 14 to 16, it will be explained that the bit lines, word lines and contact portions thereof to the read/write circuit 200 are simultaneously formed by use of a dual damascene method.

Figure 14:
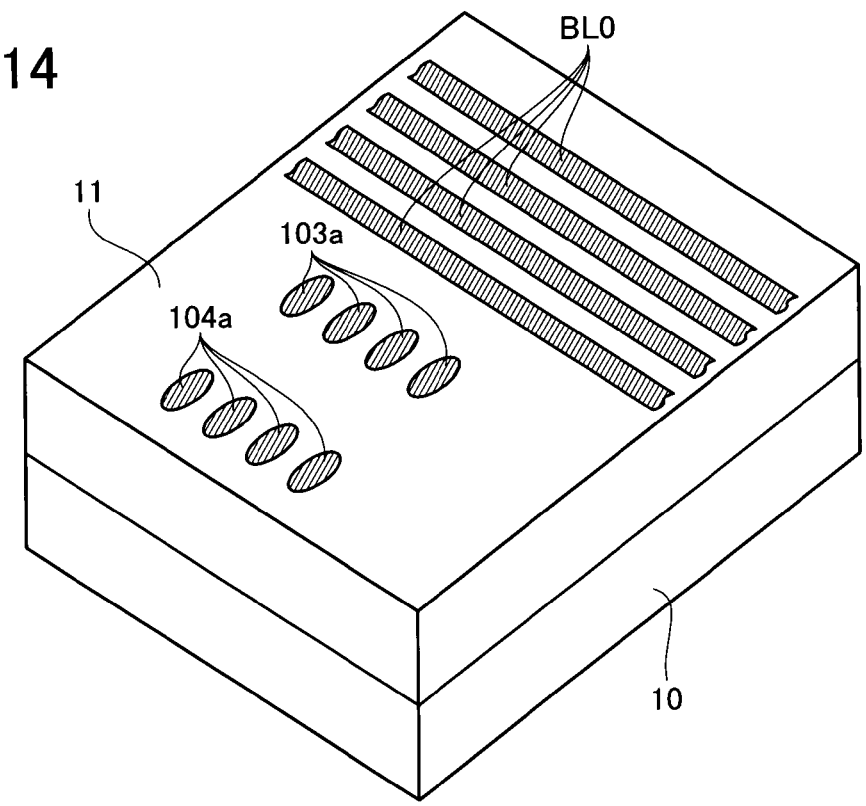
FIG. 14 is a perspective view showing the bit line forming process.

FIG. 14 shows such a state that bit lines BL0 are formed on the interlayer dielectric film 11 covering the substrate 10 on which the read/write circuit 200 has been formed. Simultaneous with the formation of these bit lines BL0, formed are contact plugs 103a, 104a by a dual damascene process. These are used for connecting the word lines WL0, WL1 to be stacked thereon to the read/write circuit 200. Although not shown in FIG. 14, other contact plugs for connecting end portions of the bit lines BL0 to the read/write circuit 200 are formed simultaneously with the contact plugs 103a, 104a.

Figure 15:
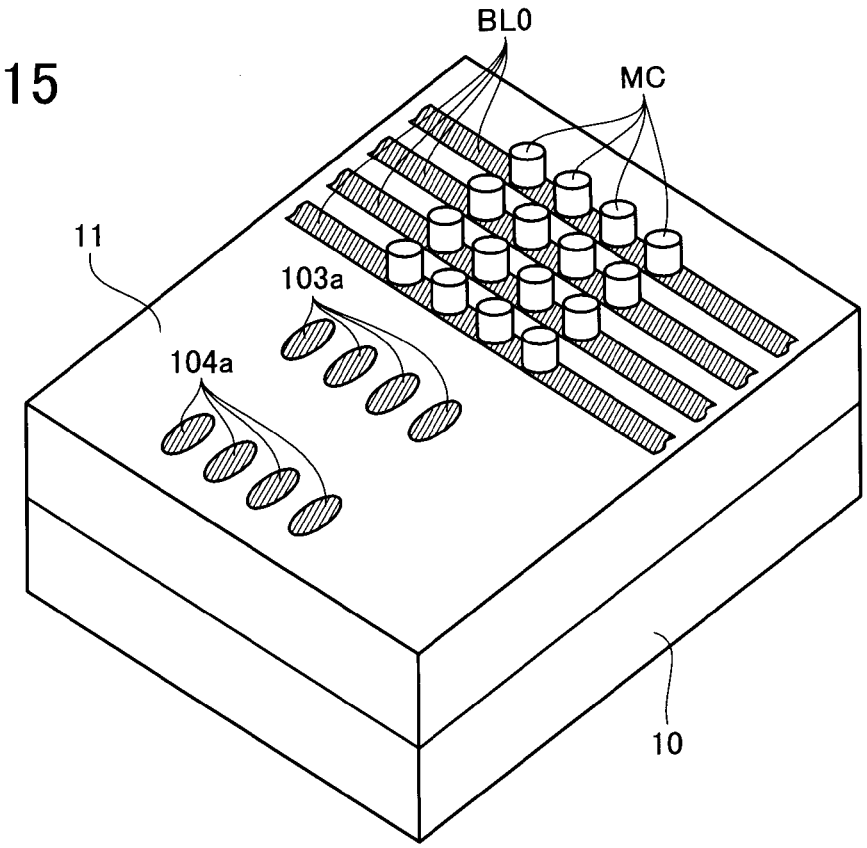
FIG. 15 is a perspective view showing the memory cell forming process.

Then, as shown in FIG. 15, memory cells, each of which is constituted by a chalcogenide and a diode stacked each other, are formed on the bit lines BL0 at a predetermined pitch.

Figure 16:
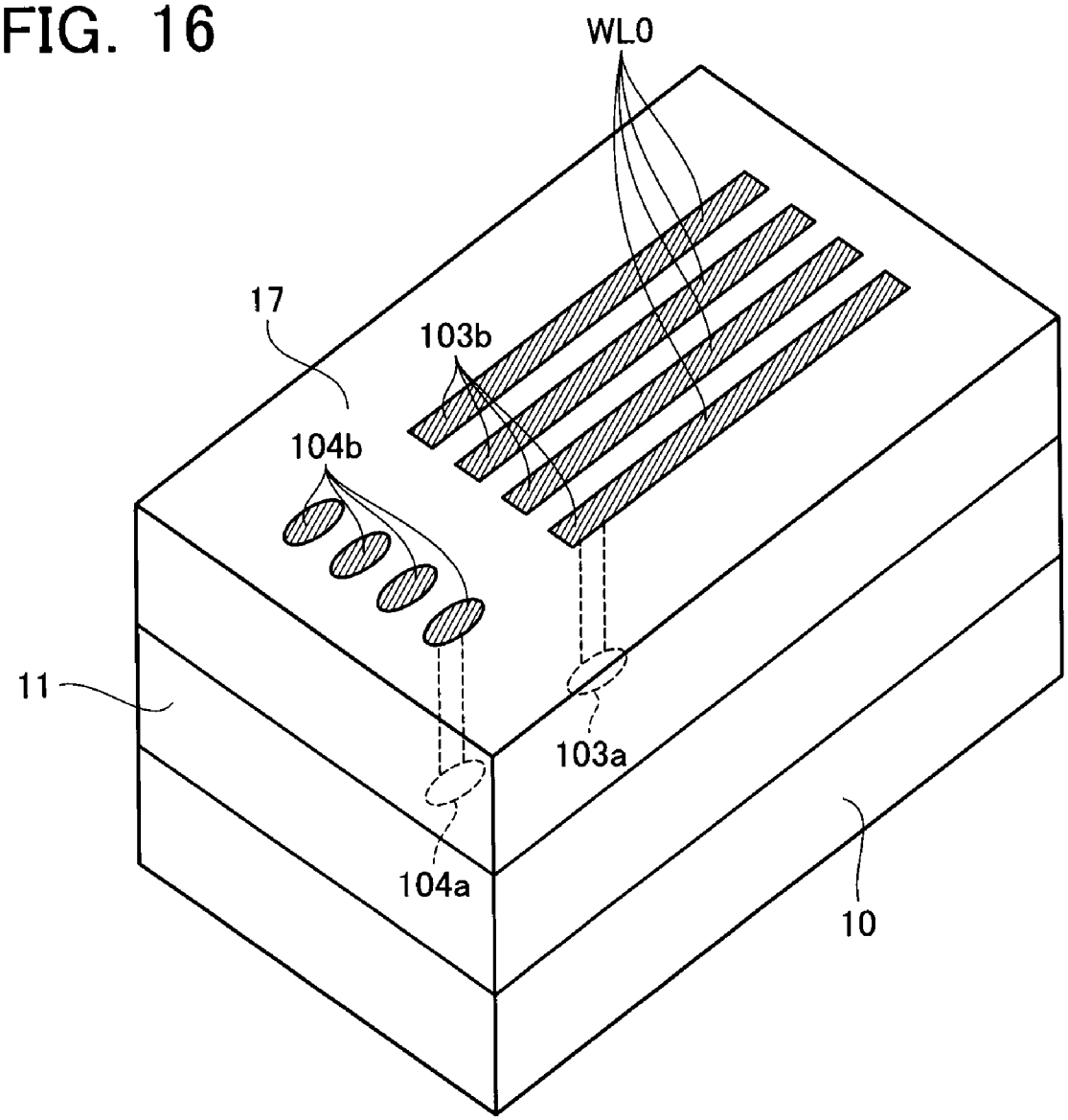
FIG. 16 is a perspective view showing the word line forming process.

Next, as shown in FIG. 16, interlayer dielectric film 17 is deposited to cover the memory cells MC, and then word lines WL0 are formed on the film 17 by a dual damascene process. In this process, contact plugs 103b and 104b, which are to be connected to the contact plugs 103a and word lines WL1 to be formed next, respectively, are buried.

Figure 17A:
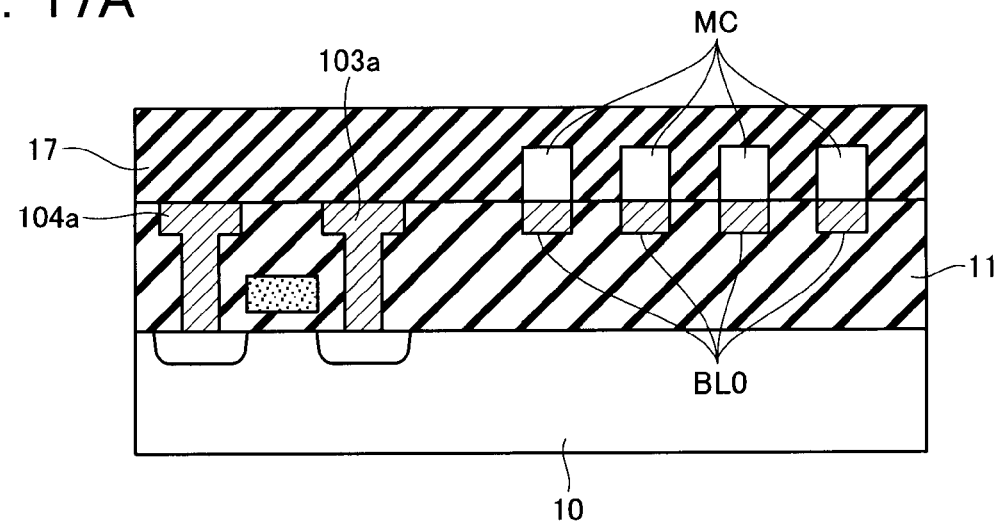
FIGS. 17A to 17C are cross-sectional views showing in detail the word line forming process.
Figure 17B:
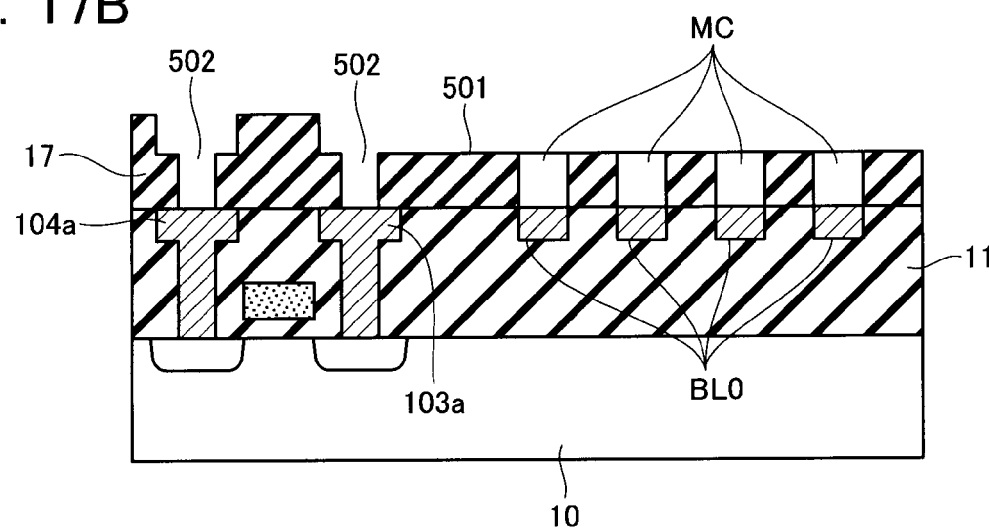
Figure 17C:
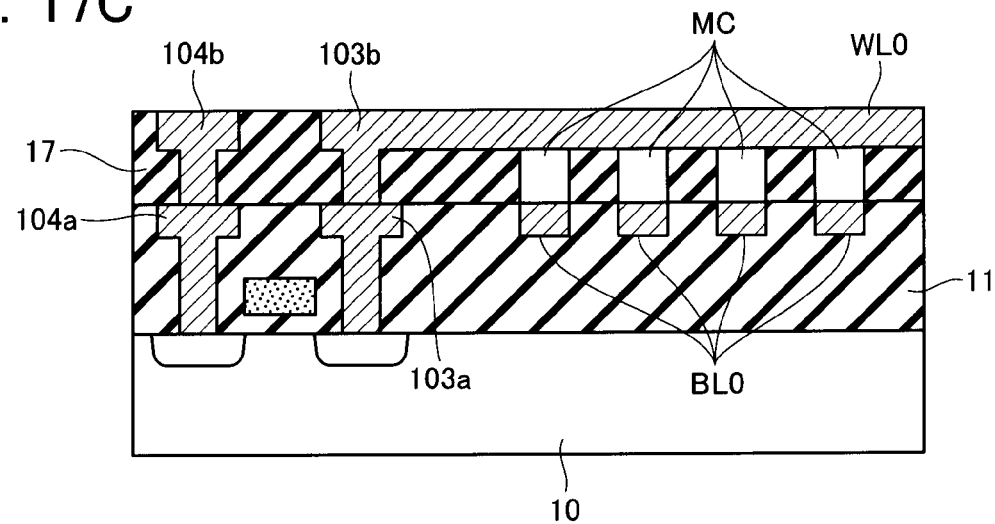

FIGS. 17A to 17C show the burying process of the word lines WL0 and contact plugs 103b, 104b in detail in a cross sectional view along the word line WL0 direction.

FIG. 17A shows such a state that the interlayer dielectric film 17 is deposited to cover the memory cells MC and then planarized. Thereafter, as shown in FIG. 17B, wiring-burying trenches 501 are formed in the interlayer dielectric film 17 by an RIE (Reactive Ion Etching) process for word line burying so as to expose the upper ends of the memory cells MC.

Further, contact holes 502 are formed at the positions where the contact plugs 103a, 104a have been buried so as to be deeper than the trenches 501.

Then, a wiring material metal layer is deposited and processed by a CMP (Chemical Mechanical Polishing) method. As a result, as shown in FIG. 17C, the word lines WL0 and the contact plugs 103b, 104b are simultaneously buried and formed. Continuously, memory cell formations, interlayer dielectric film depositions, wiring and contact plug formations by use of the damascene method are periodically performed.

By use of such processes, as shown in FIGS. 7 and 8, four layer cell arrays may be stacked in such a manner that the bit lines and word lines of each layer is connected to the read/write circuit on the substrate.

Figure 18:
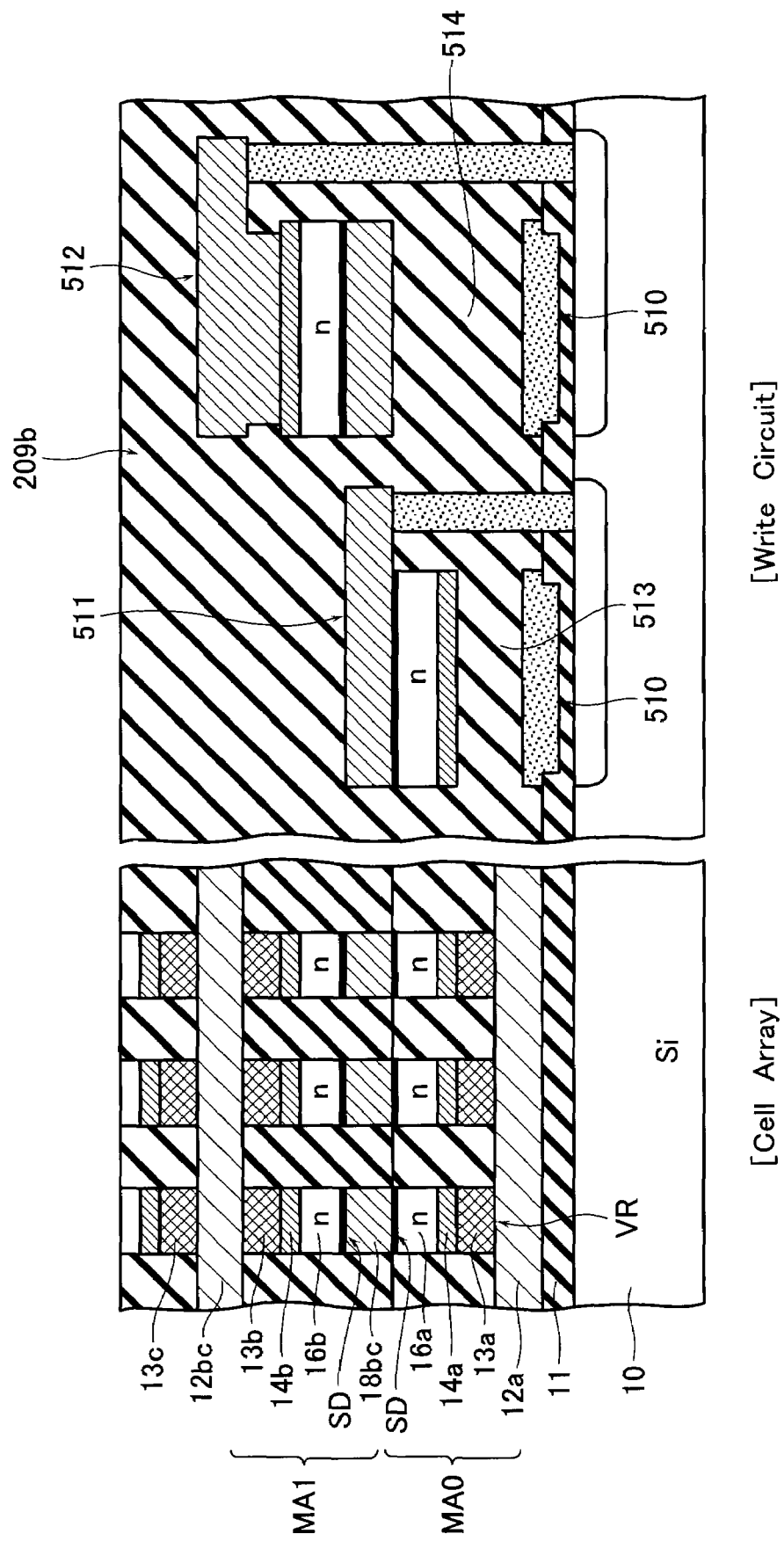
FIG. 18 is a cross-sectional view showing the relationship between the capacitor and diode of the read/write circuit and the cell array.

FIG. 18 shows a structure of the circuit portion 209b in the read/write circuit 200, that are formed simultaneously with the cell arrays. As described later, the write circuit 209 has to include capacitors and diodes for pulse-boosting.

Form these diodes simultaneously in the process of the diode formation process in the cell arrays, and then the structure of FIG. 18 may be obtained. The process will be explained in detail. As described above, transistor circuit is formed on the substrate 10 prior to the cell array formation process.

MOS capacitors 510 shown in FIG. 18 are formed in the transistor circuit formation process. Diode 511 is formed as overlying the MOS capacitors 510 by use of the formation process of diodes SD in the first cell array MA0. Similarly, diode 512 is formed by use of the formation process of diodes SD in the second cell array MA1.

In the example of FIG. 18, one diode 511 is so formed as that the anode is connected to the MOS capacitor 510 underlying the diode 511, and the other diode 512 is so formed as that the cathode is connected to the MOS capacitor 510 underlying the diode 512. As described above, it is possible to form diodes with an optional polarity as being above the MOS capacitors.

Between the diodes 511, 512 and the MOS capacitors 510, buried are interlayer dielectric films 513, 514. Note that it is possible to remain metal films used in the cell array formation process in the interlayer films 513, 514, if necessary.

By use of such the structure shown in FIG. 18, even if it is required to occupy a large area for the MOS capacitors, diodes are stacked above the MOS capacitor regions, whereby it is able to decrease the chip occupy area of the write circuit 209.

Figure 19:
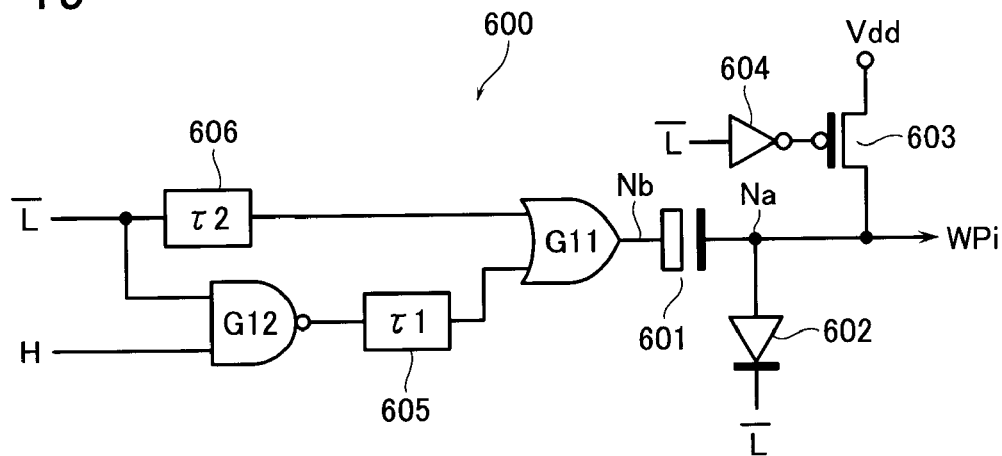
FIG. 19 is a diagram showing a write pulse generation circuit for generating a negative logic write pulse applied to a bit line.

FIG. 19 shows a write pulse generation circuit 600 used in the above-described write circuit 209 for supplying a negative logic write pulse to a selected bit line through a pulse signal line WPi. In FIG. 19, H and /L are a positive logic pulse and a negative logic pulse which are to be supplied to a selected word line and a selected bit line, respectively.

These positive logic pulse H and negative logic pulse /L are controlled of an overlap state therebetween in accordance with a to-be-written data, and the negative logic pulse is boosted in a negative direction depending on the overlap state, whereby write pulses are obtained. The overlap state of the positive logic pulse H and negative logic pulse /L is detected by a NAND gate G12.

The output of the NAND gate G12 is delayed by a certain delay time through a delay circuit 605 to be supplied to one input of an OR gate G11. The delay time $\tau 1$ of the delay circuit 605 is approximately equal to T/2, where T is a pulse width of the positive logic pulse H and the negative logic pulse /L.

The negative logic pulse /L is delayed by a certain delay time $\tau 2$ through another delay circuit 606 to be supplied to the other input of the OR gate G11. The delay time $\tau 2$ of the delay circuit 606 is sufficiently small in comparison with the delay time $\tau 1$ of the delay circuit 605.

A capacitor 601 is disposed in such a manner that one node Nb is connected to the output of the OR gate G11, and the other node Na is connected to the pulse signal wiring WPi. A diode 602 is connected to the node Na for charging the capacitor 601 to a level of the negative logic pulse /L (e.g. Vss) driven by the negative logic pulse /L.

Further, a PMOS transistor 603 is also connected to the node Na for holding the signal line WPi at a high level in a non-selected state. That is, the transistor 603 is driven by an invertor 604, to which the negative logic pulse /L is input, to hold an on-state in the non-selected state, thereby holding the pulse signal line WPi at Vdd. When the negative logic pulse is generated, the transistor 603 turns off.

Figure 20:
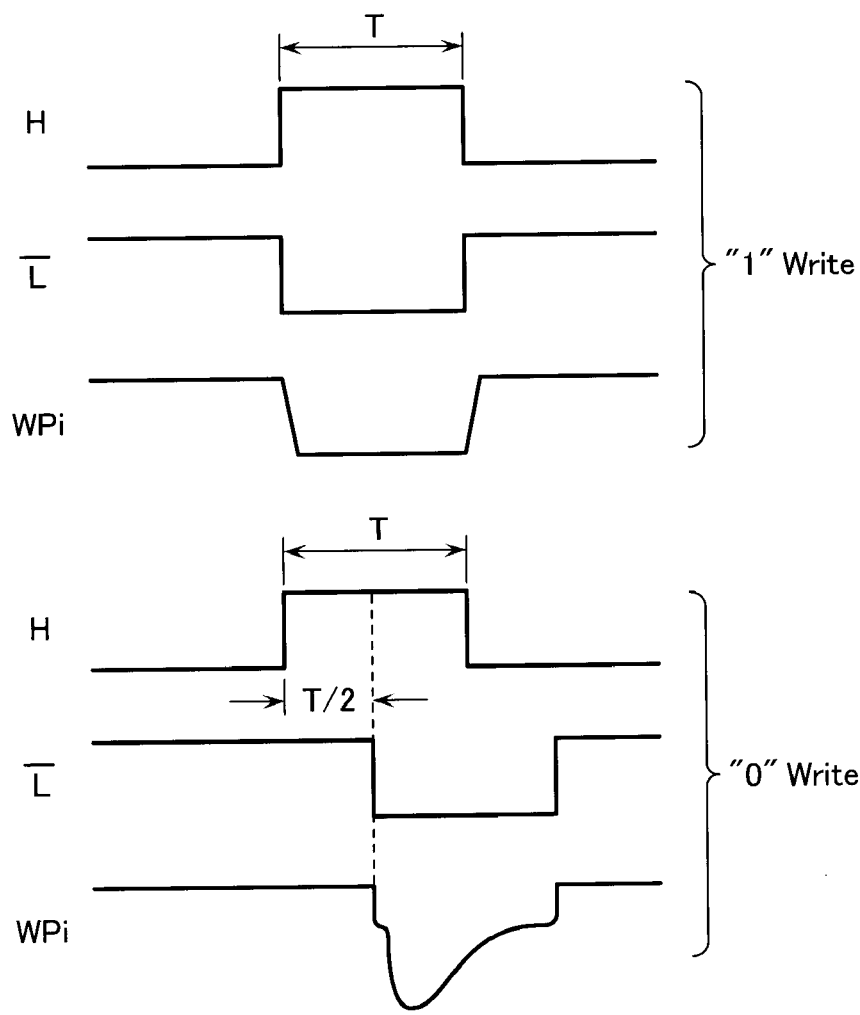
FIG. 20 is a diagram showing operational wave forms for explanation of the write pulse generation circuit.

Referring to FIG. 20, operations of the write pulse generation circuit 600 will be described bellow. In a non-selected state, the node Nb is held at "H" (=Vdd) by the OR gate G11, and the node Na is held at "H" (=Vdd) by the transistor 603.

Therefore, in this state, the write pulse signal line WPi is held at "H". When "1" write is performed, the positive and negative logic pulses H and /L are simultaneously generated. At this time, NAND gate G12 is held to output the "H" level, whereby the node Nb is held at "H".

At the same time, since the transistor 603 becomes off, the node Na is discharged through the diode 602, to which the negative logic pulse /L is supplied, to become "L" (=Vss). In contrast to this, when "0" write is performed, the negative logic pulse /L is generated with a delay time τ1 (nearly equal to T/2) relative to the positive logic pulse H. At this time, while the node Nb is held at "H", node Na is discharged by the diode 602 to become "L".

Thereafter, when the node Nb becomes "L" in receipt of a result that negative logic pulse /L is delayed by τ2 through the delay circuit 606, a negative logic write pulse, which is boosted in a negative direction within a period of about T/2, may be obtained at the node Na.

The principle of data write by use of such the pulse control is as follows. At a "1" write time, writing current flows in a selected cell during an overlap time T in which the positive logic pulse H and the negative logic pulse /L are overlapped each other.

As a result, the chalcogenide of the selected cell is annealed by self-induced heat to become a low resistance state that is crystallin-rich. At a "0" write time, writing current flows in a selected cell with a larger amount within a sorter period in comparison with that of the "1" writing time. As a result, the chalcogenide of the selected cell becomes a melting state and then rapidly cool off to become a high resistance state that is amorphous-rich.

The write pulse generation circuit 600 of FIG. 19 is shown by giving attention to one write pulse signal line WPi. Practically, in this embodiment, as described above, the lower two cell arrays MA0 and MA1 are simultaneously activated in the four cell arrays MA0 to MA3, and the upper two cell arrays MA2 and MA3 are simultaneously activated in a period different from that of the cell arrays MA0, MA1.

Further, two cells that are connected to different bit lines in a cell array constitute a pair cell for storing complementary dada.

Figure 21:
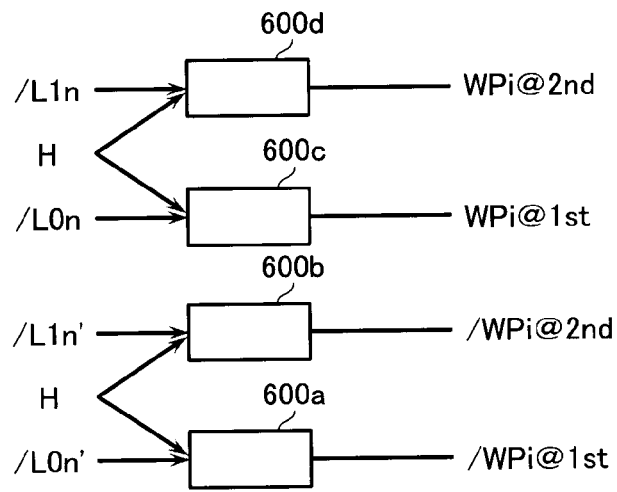
FIG. 21 is a diagram showing the relationship of input/output of the write pulse generation circuit for simultaneously activated two cell arrays.

FIG. 21 shows write pulse generation circuits 600a to 600d, which supply write pulses to two pairs of bit lines in simultaneously activated two cell arrays, and input/output relationships thereof. The outputs of the write pulse generation circuits 600a to 600d are selected by the multiplexers MUX0, MUX1 shown in FIG. 11 to be supplied to the upper two cell arrays or the lower two cell arrays.

In FIG. 21, WPi@1st and WPi@2nd are write pulse signal lines, that are to be connected to bit lines of first and second layers in the simultaneously activated two cell arrays (e.g. BL00 and BL10 in FIG. 5), respectively. /WPi@1st and /WPi@2nd are write pulse signal lines, that are to be connected to other bit lines constituting pairs with the above-described bit lines (e.g. /BL00 and /BL10), respectively.

H is a positive logic pulse to be supplied to a shared word line of two cell arrays, and /L0n, /L1n, /L0n', and /L1n' are negative logic pulses that are to be supplied to bit lines. In detail, /L0n and /L0n' are supplied to the bit line pair (e.g. BL00 and /BL00) in the lower cell array of the two cell arrays, and /L1n and /L1n' are supplied to the bit line pair (e.g. BL10 and /BL10) in the upper cell array of the two cell arrays.

As described by use of FIG. 19, the overlap states between the positive and negative logic pulses are determined based on to-be-written data, and in response to this, a negative logic writing pulse is selectively boosted to be supplied to the writing pulse signal line WPi.

Figure 22:
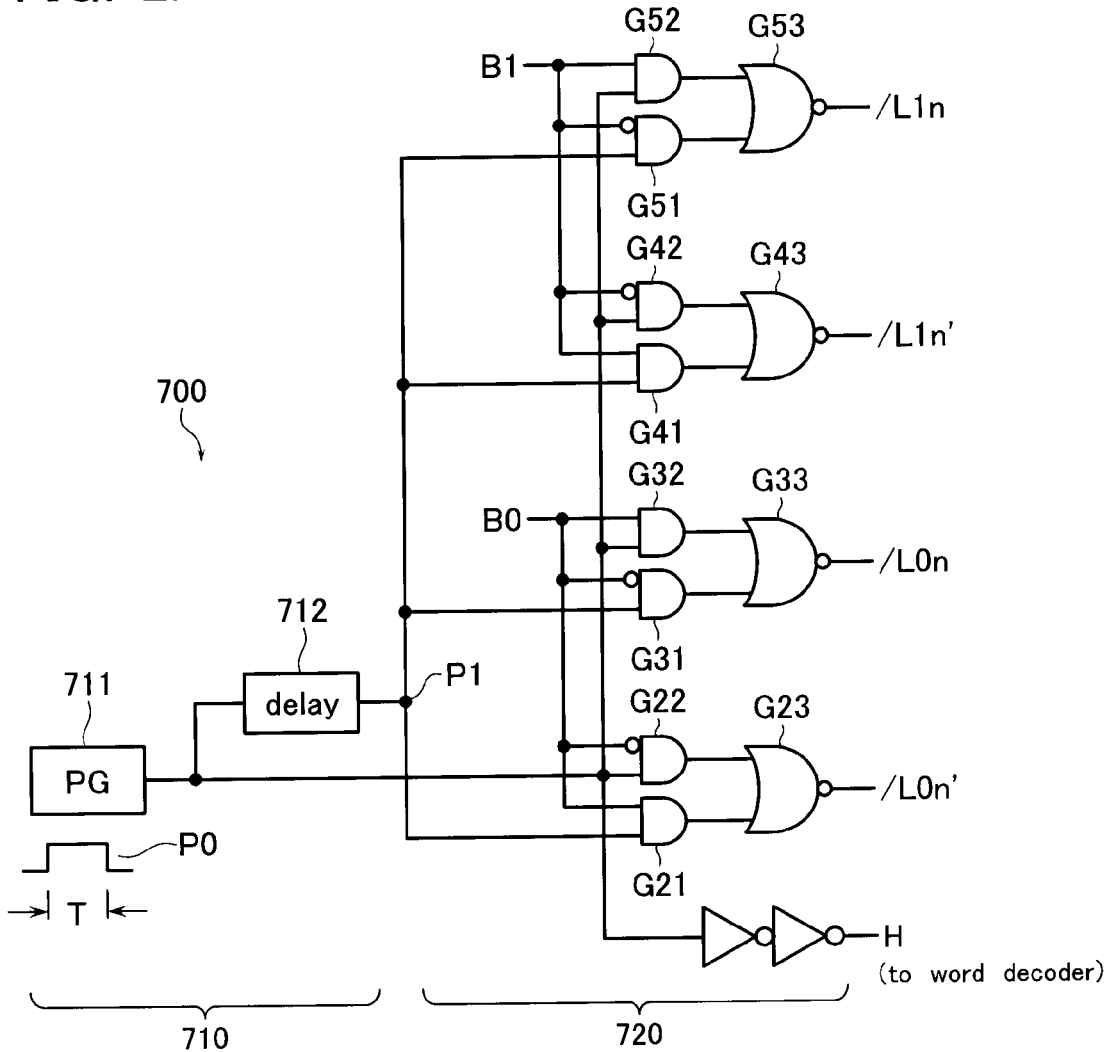
FIG. 22 is a logic pulse generation circuit for generating the input logic pulses of FIG. 21.

FIG. 22 shows a logic pulse generation circuit 700 for generating the positive and negative logic pulses shown in FIG. 21. The logic pulse generation circuit 700 is configured to have a pulse generator 710 for generating two pulses P0 and P1, that are phase-shifted each other and have a pulse width identical with each other, and a logic gate circuit 720 for generating required write pulses by combination of the two pulses.

An original pulse generation circuit 711 generates the pulse P0 with a pulse width of T, and a delay circuit 712 delays the pulse P0 to generate the pulse P1 that is delayed by about T/2. The output pulse P0 generated from the original pulse generation circuit 711 becomes the positive logic pulse H that is to be supplied to word lines through a driver.

Bit data B0 and B1 input to the logic gate circuit 720 are to-be-written data bits which are to be written to pair cells of the lower cell array and the upper cell array in the two cell arrays, respectively. Giving attention to the pair cells of the two cell arrays MA0 and MA1 in FIG. 5, a detailed example will be explained as follows: B0 is a write data to be written to the pair cell constituted by T-cell0 and C-cell0 in the cell array MA0; and B1 is a write data to be written to the pair cell constituted by T-cell and C-cell in the cell array MA1.

A set of AND gates G21, G22 and a set of AND gates G31, G32 are prepared to select the pulse P0 output of the original pulse generation circuit 711 or the pulse P1 output of the delay circuit 712 in response to whether the bit data B0 is "0" or "1".

On receipt of this selection, one of the outputs /L0n and /L0n' of NAND gates G23 and G33 becomes a negative logic write pulse for "1" writing, phase of which is identical with the positive logic pulse H, and the other becomes another negative logic write pulse for "0" writing, phase of which is delayed relative to the positive logic pulse H.

In other words, the outputs /L0n and /L0n' become negative logic write pulses for writing one T-cell0 and C-cell0 as being "0", and the other as being "1", respectively, in accordance with the bit data B0.

Similarly, a set of AND gates G41, G42 and a set of AND gates G51, G52 are prepared to select the pulse P0 or P1. Therefore, outputs /L1n and /L1n' of NAND gates G43 and G53 become negative logic write pulses for writing one of T-cell and C-cell as being "0", and the other as being "1", respectively, in accordance with the bit data B1.

Figure 23:
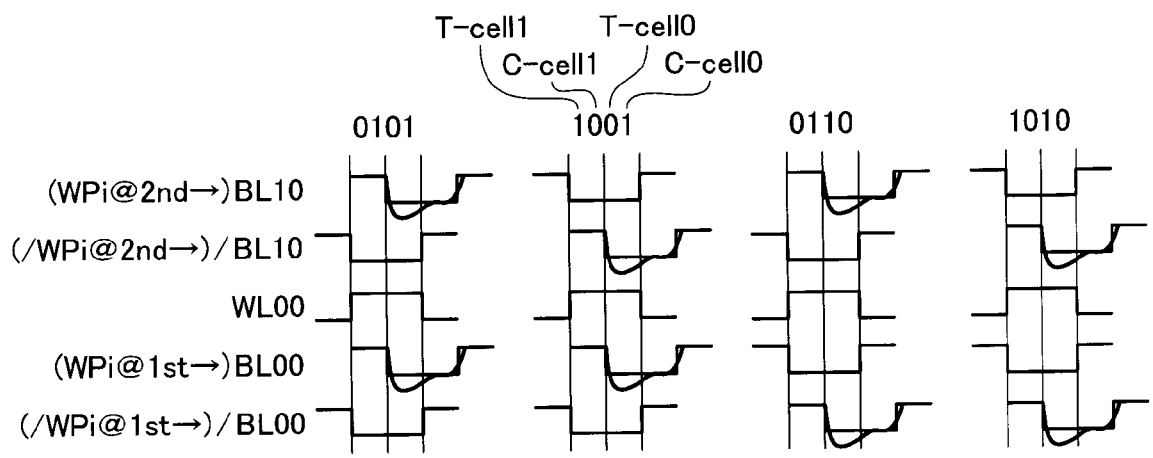
FIG. 23 shows waveforms of the write pulses for two pairs of cells.

FIG. 23 shows negative logic write pulse waveforms obtained by the positive and negative logic pulses shown in FIG. 22 that are supplied to the bit lines BL00, /B100, BL10 and /BL10 to which two pair cells of T-cell0, C-cell0 and T-cell1, C-cell1 are connected as shown in FIG. 5, for the respective write data. Four bits of data as described atop a signal wave form group are such that first bit corresponds to T-cell1, second bit to C-cell1, third bit to T-cell0 and fourth bit to C-cell0.

The positive logic pulse H shown in FIGS. 21 and 22 is supplied as it is to the word line WL0 as a positive logic write pulse. This positive logic write pulse becomes a reference pulse, and negative logic write pulses given to the respective bit lines are pulse-width controlled and boosted in correspondence with data "0", "1".

As a result, the chalcogenide of "0" written cell is melted and then rapidly cool-off to become a high resistance state, and the chalcogenide of "1" written cell is crystallized to become a low resistance state, as described above. Therefore, it is possible to perform simultaneous writing to the simultaneously activated pair cells in two cell arrays.

Additional Embodiment

Another embodiment will be explained below. The memory device according to an additional embodiment explained below is a resistance change memory, which stores a high resistance state and a low resistance state as information data, and is referred to as a phase change memory in a wide sense. Therefore, the description in the above-described embodiment with reference to FIGS. 1 to 23 may be effective as it is in the embodiment described below with the exception of the recording layer's material and recording mechanism.

A recording layer constituting a variable resistance element in this embodiment is formed of a composite compound, which contains at least one type of transition element, and has a cavity site capable of housing a metal ion (cation) diffused from an electrode.

As the electrode serving as a cation source, which supplies a metal ion to be housed in a cavity site in the recording layer, an Ag electrode is employed typically. In place of the Ag electrode, usable metals are as follows: Cu, Ni, Zn, Mg and Co.

The recording layer is, for example, composed of a two-element system metal oxide with an oxide-lack model, or a three-element system metal oxide with an oxide-lack model.

The former compound is one selected from $TiO_x$, $CuO_x$, $MnO_x$, $FeO_x$, $CoO_x$ and the like; and the latter compound is one selected from $SrTiO_x$, $BiTiO_x$, $SrZrO_x$ and the like each with a perovskite structure. In the above-described compounds, the ratio "x" is set to be smaller than stoichiometric one.

Further, generally explaining, the recording layer may be composed of one of:

i. $L_xMO_2$ where, "L" is a cation element housed in the cavity site; "M" is at least one element selected from Ti, Ge, Sn, V, Cr, Mn, Fe, Co, Ni, Nb, Ta, Mo, W, Re, Ru and Rh; and "O" is oxygen. Molar ratio "x" is selected to satisfy $1 \leq x \leq 2$.

ii. $L_xMO_3$ where, "L" is a cation element housed in the cavity site; "M" is at least one element selected from Ti, Ge, Sn, V, Cr, Mn, Fe, Co, Ni, Nb, Ta, Mo, W, Re, Ru and Rh; and "O" is oxygen. Molar ratios "x" is selected to satisfy $1 \leq x \leq 2$.

iii. $L_xMO_4$ where, "L" is a cation element housed in the cavity site; "M" is at least one element selected from Ti, Ge, Sn, V, Cr, Mn, Fe, Co, Ni, Nb, Ta, Mo, W, Re, Ru and Rh; and "O" is oxygen. Molar ratios "x" is selected to satisfy $1 \leq x \leq 2$.

iv. $L_xMPO_y$ where, "L" is a cation element housed in the cavity site; "M" is at least one element selected from Ti, Ge, Sn, V, Cr, Mn, Fe, Co, Ni, Nb, Ta, Mo, W, Re, Ru and Rh; "P" is phosphorous; and "O" is oxygen. Molar ratios "x" and "y" are selected to satisfy $0.3 \leq x \leq 3$ and $4 \leq y \leq 6$, respectively.

In these compounds, one of the following crystalline structures may be employed.

Spinel structure
Hollandite structure
Ramsdelite structure
Ilmenite structure
Wolframite structure
Anatase structure
Brookite structure
Pyrolusite structure
$ReO_3$ structure
$MoO_3$ structure
$MoO_{1.5}PO_4$ structure
$TiO_{0.5}PO_4$ structure
$FePO_4$ structure
$\beta MnO_2$
$\gamma MnO_2$
$\lambda MnO_2$
Perovskite structure In the above described composite compound, preferable ones are as follows: spinel type transition metal oxide ($AxM_2O_4$); ilmenite type transition metal oxide ($AxMO_3$); wolframite type transition metal oxide ($AxMO_4$); hollandite type transition metal oxide ($AxMO_2$); ramsdelite type transition metal oxide ($AxMO_2$); wolframite type transition metal oxide ($AxMO_4$); perovskite type transition metal oxide ($AxMO_3$); and two-element system transition metal oxide ($MO_x$). In these compounds, the ratio "x" is set to be smaller than stoichiometric one.

In FIGS. 27 to 32, there are shown combination examples of elements together with circles with respect to compound examples usable in this embodiment.

Figure 24:
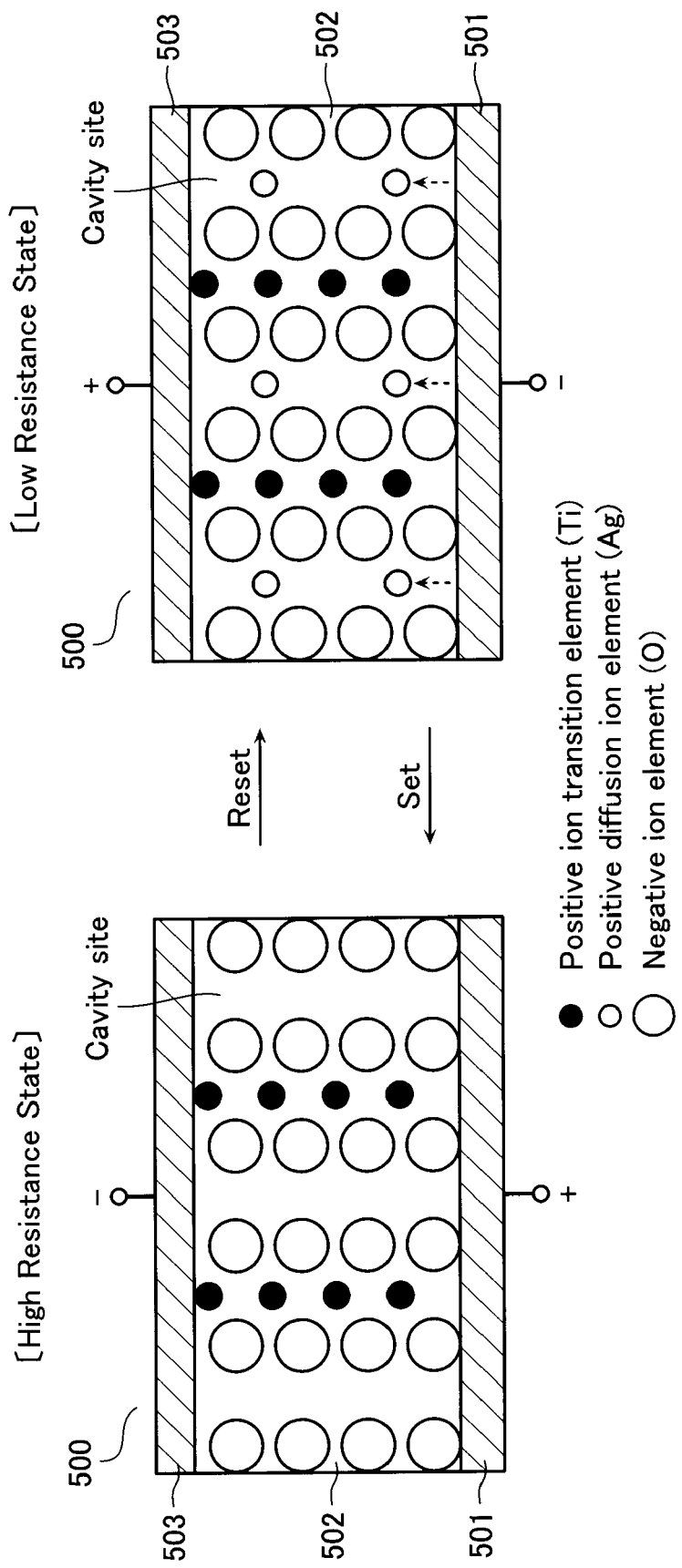
FIG. 24 is a diagram showing a variable resistance element in accordance with another embodiment.

FIG. 24 shows a variable resistance element (or unit) 500, in which the above-described composite compound is used as a recording layer 502. Explaining in detail, the recording layer 502 is a $TiO_x$ layer, and sandwiched by electrode layers 501 and 503. One of the electrodes 501 and 503, for example, the lower electrode 501 is an Ag electrode; and another electrode 503 serves as a protect layer.

A small black cycle in the recording layer 502 denotes a transition element ion (Ti ion in this example); a large white cycle denotes a negative ion, i.e., oxygen ion; and a small white cycle denotes a diffusion ion, i.e., Ag ion diffused from the electrode 501.

FIG. 24 shows an example, in which a reset state is a low resistance state (i.e., a stable state in this case), in which Ag ion has been diffused in the recording layer 502; and a set state is a high resistance state. However, it should be noted that the reset and set states may be defined reverse to those in this example. Further, the above-described "set" and "reset" are defined as: one of them is "write"; and the other is "erase".

An initial state of the recording layer 502 is such a state that cavity sites therein are empty, and it is defined as the set state here.

In the initial state, a voltage is applied to the recording layer 502 in such a manner that electrodes 501 and 503 serve as anode and cathode, respectively. With this voltage application, a large pulse current flows, thereby generating Joule-heat in the recording layer 502.

With this voltage application and Joule-heat, Ag ions are injected from the electrode 501 to be diffused, drifted and housed in the cavity sites in the recording layer 502. As a result, Ag ions (metal ions, i.e., cation ions) become excessive in the recording layer 502, and it will be set in the low resistance state (i.e., reset state).

In the reset state, when a voltage is applied in such a manner that the electrodes 501 and 502 serve as cathode and anode, respectively, Ag ions housed in the cavity sites of the recording layer 502 may be drifted and restored to the electrode 501. As a result, the recording layer 502 is set in the high resistance state (i.e., set state) with the cavity sites being empty.

Data defined by the high resistance state and the low resistance state may be read in such a manner as to supply a current pulse to the recording layer 502 and detect the resistance value thereof. It should be noted here that it is required of the current pulse used at a read time to be too small to cause resistance change of the recording layer 502.

To achieve the above-described operation principle in practice, it should be confirmed that no reset operation occurs at room temperature (i.e., retention time is sufficiently long); and power consumption of the reset operation is sufficiently small.

These conditions can be obtained by finding out a suitable moving path of the Ag ions diffused or drifted in the recording layer 502 with reference to the crystal structure thereof.

On the other hand, it is preferable to make the electrodes 501 and 503 hardly oxidized. In addition, it is desired that an electrode material has no ion conductivity. For this purpose, it is effective that, for example, the electrode 503 is formed of an electrically conductive nitride or an electrically conductive oxide.

Figure 25:
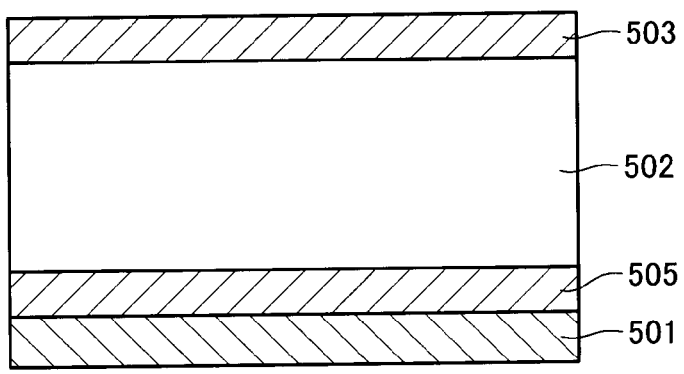
FIG. 25 shows a preferable element structure.

Further, as shown in FIG. 25, it is preferable that a barrier (or buffer) layer 505 is disposed between the electrodes 501 and the recording layer 502 for preventing reaction between Ag electrode 501 and the recording layer 502. The barrier layer 505 is, for example, formed of an electrically conductive nitride or electrically conductive oxide layer. In this case, it is required of the barrier layer 505 to be selected as to hardly disturb Ag ion transferring.

Among the above-described nitride and oxide electrode materials, $LaNiO_3$ is the most preferable material in view of comprehensive performance considering good electrical conductivity or the like. Further, the following electrode materials will be used as the electrode 503.

MN

In the formula, "M" is at least one element selected from the group consisting of Ti, Zr, Hf, V, Nb and Ta; and "N" is nitrogen.

$MO_x$

In the formula, "M" is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os and Pt; and "O" is oxygen. The molecular ratio "x" is set to satisfy $1 \leq x \leq 4$.

$AMO_3$

In the formula, "A" is at least one element selected from the group consisting of La, K, Ca, Sr, Ba and Ln; "M" is at least one element selected from the group consisting of Ti, V, Cr, Mn, Fe, Co, Ni, Cu, Zr, Nb, Mo, Ru, Rh, Pd, Ag, Hf, Ta, Re, W, Ir, Os and Pt; and "O" is oxygen.

$A_2MO_4$

In the formula, "A" is at least one element selected from the group consisting of K, Ca, Sr, Ba, and Ln; "M" is at least one element selected from the group consisting of Ti, V, Cr, Mn, Fe, Co, Ni, Cu, Zr, Nb, Mo, Ru, Rh, Pd, Ag, Hf, Ta, W, Re, Ir, Os and Pt; and "O" is oxygen.

A protective layer may also be employed in place of the electrode 503. In this case, the protective layer is formed of an insulator or conductive material.

Figure 26A:
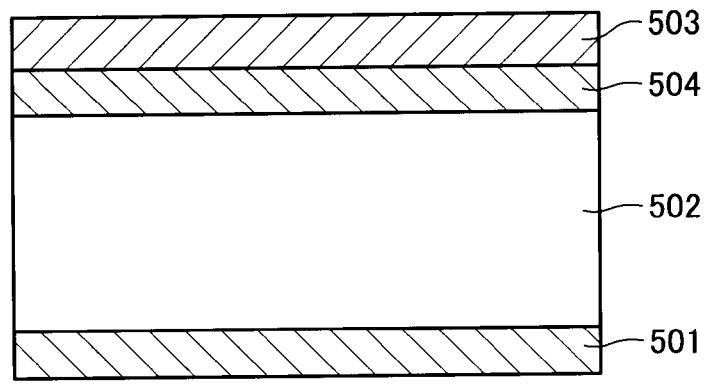
FIGS. 26A to 26C each shows a modified element structure with a heater layer(s) disposed.
Figure 26B:
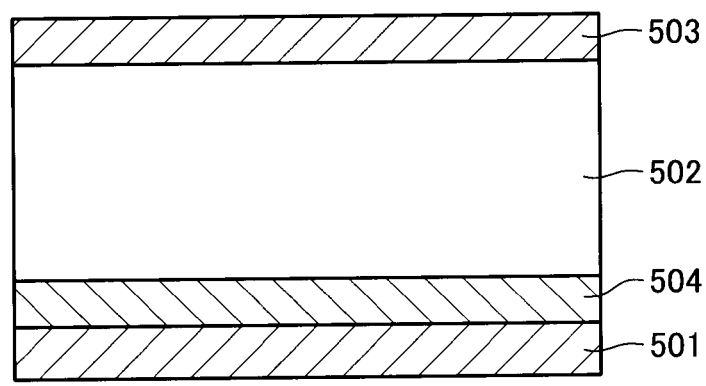
Figure 26C:
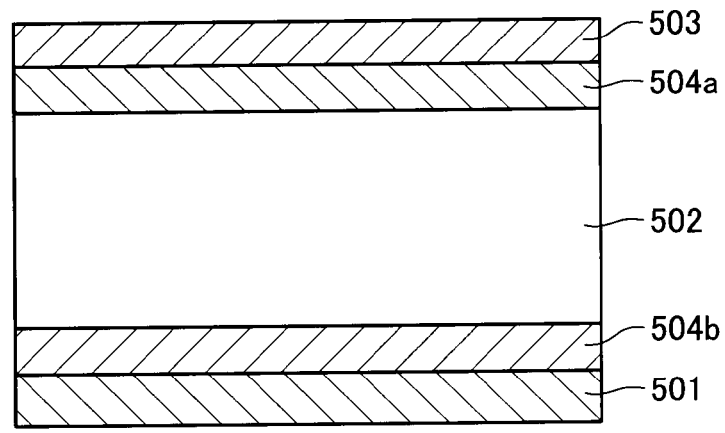

To efficiently carry out heating of the recording layer 502 in the reset operation, for example as shown in FIG. 26A, it is preferable to provide a heater layer 504 with a resistivity of $10^{-5}/\Omega\text{-cm}$ or more at the side of upper electrode 503. Alternatively, such the heater layer 504 may be disposed on the side of the lower electrode 501 as shown in FIG. 26B. Further, as shown in FIG. 26C, heater layers 504a and 504b may be formed on the sides of the electrodes 501 and 503, respectively.

Note here that in case the heater layer 504 is disposed on the side of Ag electrode 501, it is required of it to be Ag ion transferable.

Further, the recording layer 502 may possess a plurality of microstructures that have in common a continuous crystalline path between the electrodes 501 and 503 in at least a part of the recording layer 502. The recording layer may consist of a single-crystal film containing no grain boundary or a crystal film, the grain size of which is smaller than the lateral size of a memory cell.

A polycrystalline or amorphous film may also be used as the recording layer 502 if the film contains at least one columnar crystalline region that forms a continuous crystalline path between the electrodes. This embodiment remains effective regardless of the way in which the crystalline path between the electrodes 501 and 503 is formed. The recording layer 502 may, for example, be deposited during device manufacture in an amorphous or nanocrystalline form, and the columnar crystalline region is formed by local Joule heating during an initial forming stage of the device under a suitable bias current. As a result, the set/reset operation described above will be achieved by use of the cation movement in the crystalline regions of the recording layer 502.

What is claimed is:

1. A resistance change memory device comprising:
   a semiconductor substrate;
   a plurality of cell arrays stacked above the semiconductor substrate, each cell array having memory cells arranged in a matrix manner, bit lines each commonly connecting one ends of plural memory cells arranged in a first direction of the matrix and word lines each commonly connecting the other ends of plural memory cells arranged in a second direction of the matrix;
   a read/write circuit formed on the semiconductor substrate as underlying the cell arrays for reading and writing data of the cell arrays;
   first and second vertical wirings disposed outside of first and second boundaries that define a cell layout region of the cell arrays in the first direction to connect the bit lines of the respective cell arrays to the read/write circuit; and
   third vertical wirings disposed outside of one of third and fourth boundaries that define the cell layout region in the second direction to connect the word lines of the respective cell arrays to the read/write circuit, wherein
   the memory cell comprises a variable resistance element for storing as information a resistance value, and wherein the variable resistance element includes:
   a recording layer formed of a composite compound containing at least one transition element and a cavity site for housing a cation ion; and
   electrodes formed on the opposite sides of the recording layer, one of the electrodes serving as a cation source in a write or erase mode for supplying a cation to the recording layer to be housed in the cavity site therein.

2. The resistance change memory device according to claim 1, wherein
   the composite compound serving as the recording layer is one selected from the group consisting of: spinel type compound ($A_xM_2O_4$); illumenite type compound ($A_xMO_3$); wolframite type compound ($A_xMO_4$); hollandite type compound ($A_xMO_2$); ramsdelite compound ($A_xMO_2$); two-element system metal oxide selected from $TiO_x$, $CuO_x$, $MnO_x$, $FeO_x$ and $CoO_x$; and perovskite type compound selected from $SrTiO_x$, $BiTiO_x$ and $SrZrO_x$ (where, "x" is set to be smaller than stoichiometric one), and
   the electrode serving as the cation source is formed of one selected from Ag, Cu, Ni, Zn, Mg and Co.

3. The resistance change memory device according to claim 1, wherein
   the memory cell has a stack structure of a variable resistance element and a diode as disposed at each cross portion of the bit lines and word lines in the respective cell arrays.

4. The resistance change memory device according to claim 3, wherein
   the diode of the memory cell is serially connected to the variable resistance element between the bit line and the word line, and wherein
   the bit lines and word lines are so potentially fixed as to reversely bias the diode in a non-selected mode, while a selected bit line and a selected word line are pulse driven in negative and positive directions, respectively, in data read and write modes.

5. The resistance change memory device according to claim 1, wherein
the cell arrays are so stacked as to share bit lines and word lines with adjacent two cell arrays.

6. The resistance change memory device according to claim 1, wherein
the first to third vertical wirings are contact plugs which are buried in an interlayer dielectric film surrounding the cell arrays.

7. The resistance change memory device according to claim 1, wherein
neighboring two memory cells in each the cell array constitute a pair cell for storing complementary data one of which is a high resistance value state, and the other is a low resistance value state, and wherein
the complementary data of the pair cell are read out to a bit line pair as one bit of data.

8. The resistance change memory device according to claim 7, wherein
the pair cell is selected such that another bit line is disposed between the bit line pair to which the complementary data are read out.

9. The resistance change memory device according to claim 1, wherein
the read/write circuit comprises:
a global bus region having a plurality of data lines to which read data are transferred and a plurality of write pulse signal lines for transferring write pulses to the bit lines, the data lines and the write pulse signal lines being so disposed as to cross a central portion of the cell layout region in the second direction;
first and second bit line select circuits disposed along the first and second boundaries of the cell layout region, respectively, to which the respective bit lines of neighboring two cell arrays are connected;
first and second sense amp arrays for sensing data of bit lines selected by the first and second bit line select circuits, respectively, the first and second sense amp arrays being disposed between the first, second bit line select circuits and the global bus region, respectively;
a word line select circuit disposed along one of the third and fourth boundaries of the cell layout region, to which shared word lines of the neighboring two cell arrays are connected; and
a write circuit disposed along the other of the third and fourth boundaries of the cell layout region for generating the write pulses supplied to the write pulse signal lines.

10. The resistance change memory device according to claim 9, wherein
the shared word lines are simultaneously activated for a certain range which is selected by the word line select circuit, and the respective bit lines of the neighboring two cell arrays are simultaneously selected for the respective certain ranges which are selected by the first and second bit line select circuits, respectively, thereby simultaneously accessing to the respective plural memory cells in the neighboring two cell arrays.

11. The resistance change memory device according to claim 10, wherein
the first and second sense amp arrays have sense amps for simultaneously sensing data of the respective plural memory cells which are simultaneously selected in the neighboring two cell arrays, sensed data of which are simultaneously transferred to the data lines in the global bus region.

12. The resistance change memory device according to claim 10, wherein
the write circuit is configured to simultaneously output write pulses, which are to be transferred to the respective plural bit lines simultaneously selected in the neighboring two cell arrays, to the write pulse signal lines in the global bus region.

13. The resistance change memory device according to claim 9, wherein
neighboring two memory cells in each the cell array constitute a pair cell for storing complementary data, one of which is a high resistance value state and the other is a low resistance value state, and wherein
each of the first and second sense amp arrays comprises differential type current sensing amplifiers arranged therein, each of the current sensing amplifiers being connected to a bit line pair to which the pair cell is connected for sensing a current difference due to the complementary data.

14. The resistance change memory device according to claim 9, wherein
the write circuit comprises:
a logic pulse generation circuit for generating positive logic pulses and negative logic pulses to be supplied to selected word lines and selected bit lines in each the cell array, respectively, the positive logic pulses and negative logic pulses being controlled to have overlap widths therebetween in correspondence with write data; and
a write pulse generation circuit for selectively boosting the negative logic pulses output from the logic pulse generation circuit in correspondence with write data to output the write pulse signal lines.

15. The resistance change memory device according to claim 14, wherein
the logic pulse generation circuit comprises:
a pulse generation circuit for generating two pulses with the same pulse width, which are phase-shifted each other; and
a logic gate circuit for outputting the negative logic pulses and positive logic pulses with an overlap time determined by combination logics determined depending on write data.

16. The resistance change memory device according to claim 1, wherein
the plurality of cell arrays comprise:
a first cell array having a plurality of mutually parallel first bit lines formed on an interlayer dielectric film covering the read/write circuit, a plurality of memory cells laid out on each first bit line at a prespecified pitch, and a plurality of first word lines laid out on the memory cells in such a manner as to commonly connect together plural memory cells aligned in a direction crossing the first bit lines;
a second cell array being formed above the first cell array while sharing the first word lines with the first cell array and having a plurality of memory cells arrayed in the same layout as the first cell array and a plurality of second bit lines overlying the memory cells in such a manner as to commonly connect together plural memory cells aligned in a direction crossing the first word lines;
a third cell array being formed above the second cell array while sharing the second bit lines with the second cell array and having a plurality of memory cells laid out in the same layout as the second cell array and a plurality of second word lines overlying the memory cells in such a manner as to commonly connect together plural memory cells aligned in a direction crossing the second bit lines; and a fourth cell array being formed above the third cell array while sharing the second word lines with the third cell array and having a plurality of memory cells disposed in the same layout as the memory cells of the third cell array and a plurality of third bit lines overlying the memory cells in such a manner as to commonly connect together plural memory cells aligned in a direction crossing the second word lines.

17. The resistance change memory device according to claim 16, wherein
the memory cell of each the cell array has a variable resistance element and a diode which are stacked at each corresponding cross portion of the first to third bit lines and the first and second word lines.

18. The resistance change memory device according to claim 17, wherein
the lamination order of the variable resistance element and diode is inverse between upper and lower neighboring cell arrays, and the diode is formed to have a polarity with the side of the first to third bit lines as a cathode.

19. The resistance change memory device according to claim 16, wherein
the read/write circuit comprises:
a global bus region having a plurality of data lines to which read data are transferred and a plurality of write pulse signal lines for transferring write pulses to the bit lines, the data lines and the write pulse signal lines being so disposed as to cross a central portion of the cell layout region in the second direction;
a first bit line select circuit disposed along the first boundary of the cell layout region, to which the first and third bit lines are commonly connected;
a second bit line select circuit disposed along the second boundary of the cell layout region, to which the second bit lines are connected;
first and second sense amp arrays for sensing data of bit lines selected by the first and second bit line select circuits, respectively, the first and second sense amp arrays being disposed between the first, second bit line select circuits and the global bus region, respectively;
a word line select circuit disposed along one of the third and fourth boundaries of the cell layout region, to which the first and second word lines are connected; and
a write circuit disposed along the other of the third and fourth boundaries of the cell layout region for generating the write pulses supplied to the write pulse signal lines.

20. The resistance change memory device according to claim 19, wherein
the word line select circuit is configured to simultaneously activate a certain range of either one of the first and second word lines, and wherein
the first and second bit line select circuit are configured to simultaneously select a certain range of either one of the first and third bit lines, and simultaneously select a certain range of the second bit lines, respectively.

21. The resistance change memory device according to claim 20, wherein
the first and second sense amp arrays have sense amps for simultaneously sensing data of the respective plural memory cells which are simultaneously selected in the first and second cell arrays or in the third and fourth cell arrays, sensed data of which are simultaneously transferred to the data lines in the global bus region.

22. The resistance change memory device according to claim 20, wherein
the write circuit is configured to simultaneously output write pulses, which are to be transferred to the respective plural bit lines simultaneously selected in the first and second cell arrays or in the third and fourth cell arrays, to the write pulse signal lines in the global bus region.

23. The resistance change memory device according to claim 16, wherein
neighboring two memory cells sharing the first or second word lines in each of the first to fourth cell arrays constitute a pair cell for storing complementary data one of which is a high resistance value state, and the other is a low resistance value state, and wherein
the complementary data of the pair cell are read out to a bit line pair as one bit of data.

24. The resistance change memory device according to claim 23, wherein
the pair cell is selected such that another bit line is disposed between the bit line pair to which the complementary data are read out.

* * * * *